United States Patent
Gambino et al.

(10) Patent No.: US 6,204,532 B1
(45) Date of Patent: Mar. 20, 2001

(54) PILLAR TRANSISTOR INCORPORATING A BODY CONTACT

(75) Inventors: Jeffrey Peter Gambino, Gaylordsville, CT (US); Jack Allan Mandelman, Stormville, NY (US); Stephen Anthony Parke, Nampa, ID (US); Matthew Robert Wordeman, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/412,866

(22) Filed: Oct. 5, 1999

Related U.S. Application Data

(62) Division of application No. 09/014,960, filed on Jan. 28, 1998, now Pat. No. 6,020,239.

(51) Int. Cl.$^7$ .................................................. H01L 29/76
(52) U.S. Cl. ........................ 257/329; 257/330; 257/332; 257/347
(58) Field of Search ............................... 257/328, 329, 257/330, 331, 332, 333, 334, 347, 348, 349, 350, 351, 353, 354

(56) References Cited

U.S. PATENT DOCUMENTS

| | | | |
|---|---|---|---|
| 4,105,475 | * 8/1978 | Jenne | 148/175 |
| 4,116,720 | * 9/1978 | Vinson | 148/1.5 |
| 5,016,067 | 5/1991 | Mori | 357/23.4 |
| 5,072,276 | 12/1991 | Malhi et al. | 357/42 |
| 5,155,054 | 10/1992 | Itoh | 437/41 |
| 5,283,456 | 2/1994 | Hsieh et al. | 257/347 |
| 5,304,831 | 4/1994 | Yilmaz et al. | 257/341 |
| 5,393,999 | 2/1995 | Malhi | 257/289 |
| 5,517,046 | 5/1996 | Hsing et al. | 257/336 |
| 5,627,390 | 5/1997 | Maeda et al. | 257/302 |
| 6,100,123 | * 8/2000 | Bracchitta et al. | 438/199 |

FOREIGN PATENT DOCUMENTS 63-129667  * 6/1988 (JP) ..................................... 257/329

OTHER PUBLICATIONS

Schuster, S.E.. One–Device Memory Structure Using Various–Depth V–Groove Openings, IBM Tech. Discl. Bull., vol. 22, No. 8B, Jan. 1980.*

* cited by examiner

Primary Examiner—Sara Crane
(74) Attorney, Agent, or Firm—Schmeiser, Olsen & Watts; Eugene Shkurko

(57) ABSTRACT

According to the present invention, a method for fabricating vertical circuit devices which include a body contact is disclosed. During the fabrication process, the body of a transistor is formed from a pillar of single crystal silicon. The silicon pillar is formed over a butted junction of N+ and P+ diffusions. This fabrication process results in a pillar structure which has an n+ diffusion contacting a portion of the base of the transistor body and a P+ diffusion contacting the remainder of the base of the transistor body. The proportion of N+ and P+ area at the base of the silicon pillar depends on the overlay of the opening to the butted junction. Gate oxide is grown over the entire pillar and a polysilicon gate material is then deposited and etched to form the transistor gate. Metal contact studs are formed, preferably via deposition. After fabrication, the entire surface of the device can be planarized by using any standard Chemical Mechanical Planarization (CMP) process.

13 Claims, 29 Drawing Sheets

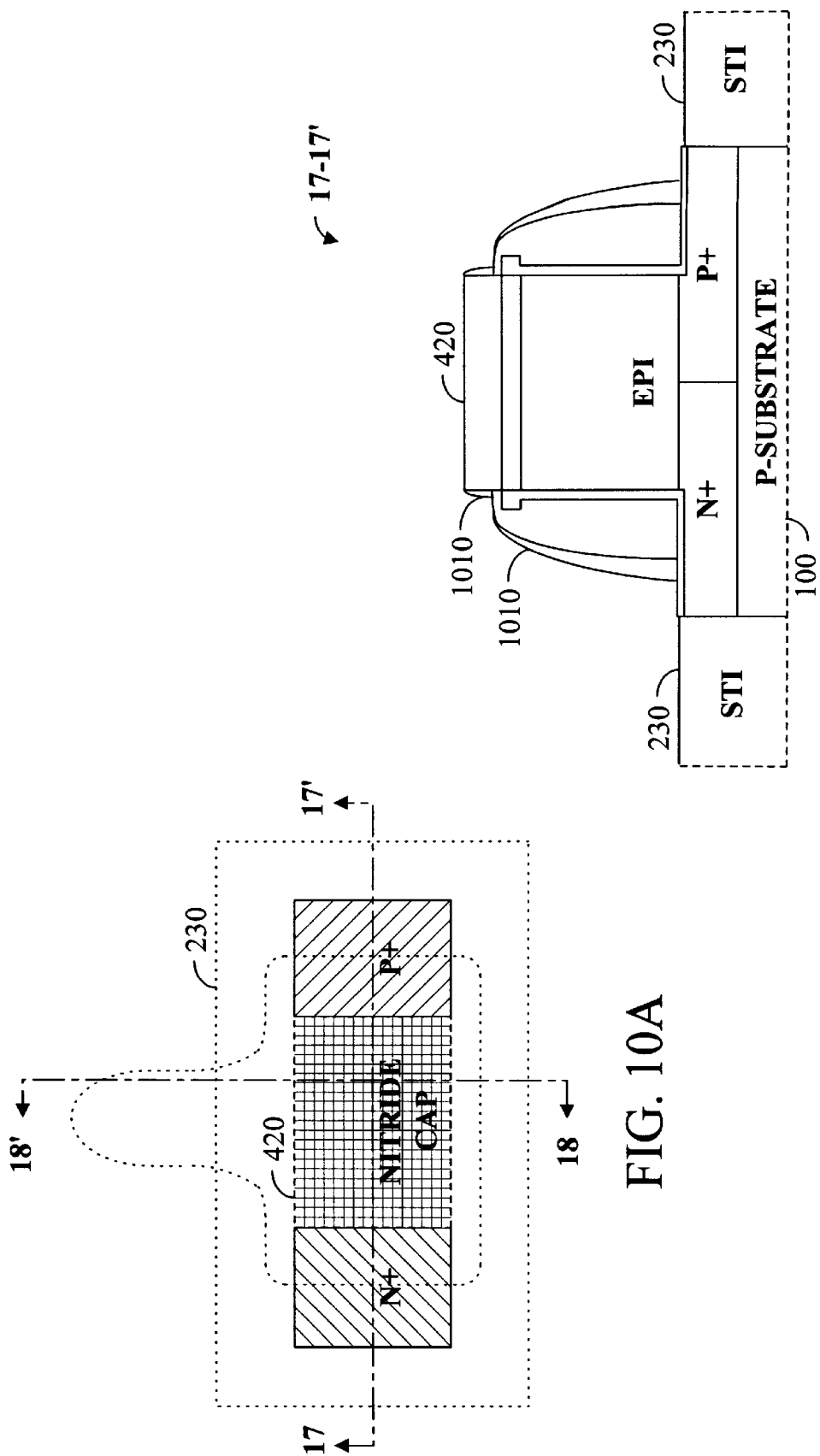

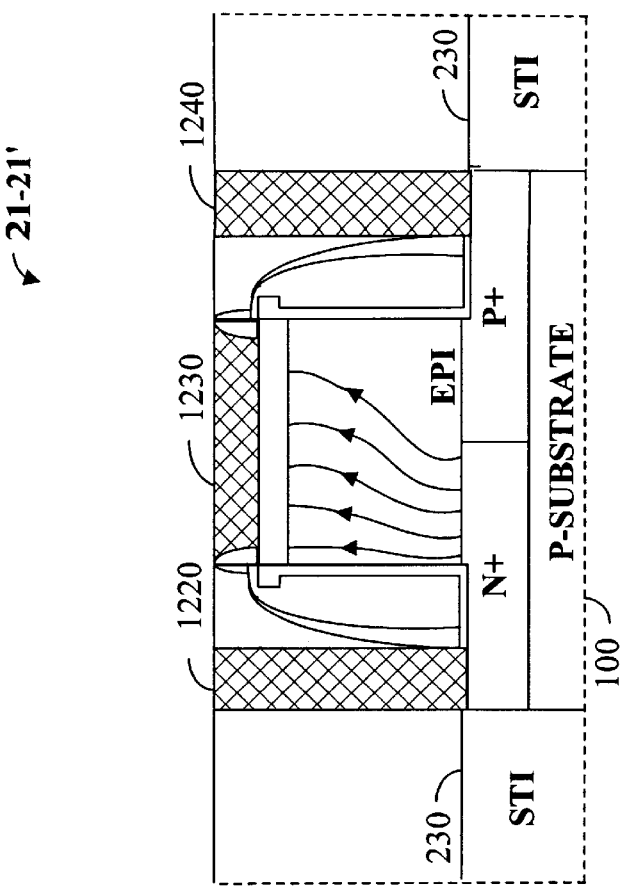
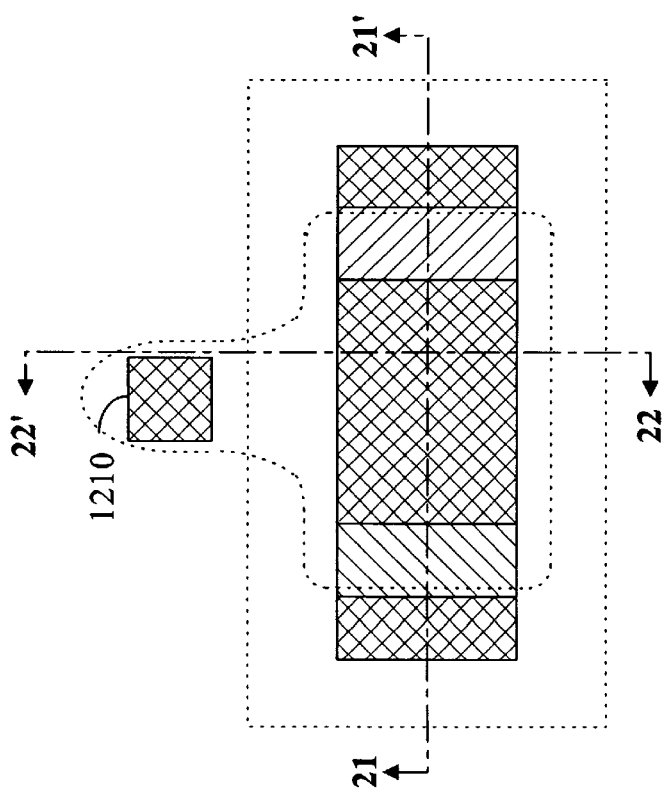
FIG. 12B
FIG. 12A

PILLAR TRANSISTOR INCORPORATING A BODY CONTACT

This application is a divisional of Ser. No. 09/014,960, filed Jan. 28, 1998, now U.S. Pat. No. 6,020,239.

BACKGROUND OF THE INVENTION

1. Technical Field

This invention generally relates to the field of semiconductor processing and integrated circuit manufacturing. More specifically, the present invention relates to vertical scaling of semiconductor devices.

2. Background Art

Today, our society is heavily dependent on high-tech electronic devices for everyday activity. Integrated circuits are the components that give life to our electronic devices. Integrated circuits are found in widespread use throughout the world, in appliances, in televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities throughout the world. Improved integrated circuit manufacturing processes have led to drastic price reductions and performance enhancements for these devices.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers.

Integrated circuits are chemically and physically integrated into a substrate material, such as a silicon or gallium arsenide wafer, by combining electrically conductive, semiconductive, and insulating (dielectric) layers or regions. The layers and regions are arranged to form electronic components or devices such as transistors, diodes, and capacitors. Millions of these devices are formed essentially simultaneously on the surface of a single wafer of semiconductor material during processing.

For example, in a typical fabrication process, a layer of aluminum or some other metal is deposited on the surface of the wafer substrate. The metal layer is patterned to form interconnect paths along the surface of the wafer substrate. The substrate typically contains certain dopant materials which form transistor components. Examples of possible substrate components include N-wells or P-wells, sources, drains, and junctions. In most processes, an insulating or dielectric layer is then deposited over the first metal layer. Vias, or holes, are then created in the dielectric layer and a second metal layer is deposited over the dielectric layer. The second metal layer covers the intervening dielectric layer and fills the via openings in the dielectric layer down to the first metal layer. These filled via openings provide electrical connections between the first and second metal layers. The second metal layer is also patterned to form additional circuit devices and paths. The dielectric layer acts as an insulator between the first and second metal layer. This process can be repeated with additional layers as necessary to create the desired functionality in the circuits located on the wafer.

As the art of semiconductor fabrication has progressed, horizontal scaling has become an increasingly important concern. Specifically, the current emphasis in most fabrication processes is the effort to increase device density by shrinking the amount of real estate each individual device or component occupies on the surface of the wafer. In order to minimize package and device sizes, and maximize device yield for a given wafer size, the goal is to pack as may circuit elements as possible in a given square centimeter of surface area. While great advances in horizontal scaling have been realized, there are certain physical limitations which currently impede additional reductions.

One of the most significant problems experienced as devices get smaller is channel length reduction. Since the width of the gate conductor defines the channel length, as the width of the gate conductor decreases, the channel length also decreases. Due to well known fabrication process variations, the channel length will vary. As the dimensions get scaled down, the channel tolerances are not able to keep pace with the reduced channel dimensions. Furthermore, as the channel length decreases, operational problems associated with "short channel effect" become apparent. As is well known to those skilled in the art, short channel effects can result in threshold voltage roll-off along with increased variations in the threshold voltage and on-current of the transistors, and increased sub-threshold leakage. While sub-threshold leakage can be minimized somewhat by increasing the level of dopants used in the fabrication process, this can introduce other problems such as junction leakage and "hot electron" effects.

In an effort to overcome the physical processing limitations associated with horizontal scaling, recent research and development activities have increasingly focused on the ability to construct devices with a vertical orientation.

While various techniques have met with some limited success, there is no significant consistency in the techniques currently practiced. Vertical fabrication is expensive because it is a new technology and the fabrication processes required to produce vertical devices are not as well developed as the processes used to fabricate horizontal transistors. Many of the techniques used to produce vertical transistors are more costly than their horizontal counterparts.

Typically, to create a vertical device such as a transistor, the fabrication process creates an N+ source/drain diffusion on the bottom and a source/drain diffusion on the top of a silicon pillar. The source/drain diffusion on the bottom covers the entire base of the silicon pillar and the silicon pillar is not in direct electrical contact with the substrate. This fabrication process electrically isolates the transistor body from the substrate.

The isolation of the transistor body from the underlying substrate creates a phenomenon known as "floating body" effects and can cause certain problems that are well known to those skilled in the art. Floating body effects are also typical in a class of devices known as Silicon On Insulator (SOI) devices and include hysterisis of electrical characteristics, lower breakdown voltages, latch-up, and other related functionality and reliability problems. For example, during operation of a typical SOI transistor, electrical charges can accumulate in the transistor, until the associated electrical potential increases sufficiently to produce a shift in the threshold voltage ($V_T$) of the transistor. This shift can adversely affect the operation of the circuit and introduce errors into the information being processed by the device. Depending on the tolerance level for critical errors, this may or may not be acceptable in a given circuit application. These various problems make circuit designs using vertical devices with floating bodies unacceptable for many circuit applications.

Therefore, there exists a need to provide improved processing methods for creating vertical semiconductor devices. In addition, new types of vertical device structures would allow circuit designers to further increase circuit density and improve circuit performance. Without new processing methods for creating reliable vertical semiconductor devices, the existing limitations of the presently known fabrication processes will prevent dramatic improvements in component density. This, in turn, will prevent widespread adoption of vertical scaling in integrated circuit design and fabrication processes and hinder the concomitant performance gains.

DISCLOSURE OF INVENTION

According to the present invention, a method for fabricating vertical circuit devices which include a body contact is disclosed. During the fabrication process, the body of a transistor is formed from a pillar of single crystal silicon. The silicon pillar is formed over a butted junction of n+ and p+ diffusions. This fabrication process results in a pillar structure which has an n+ diffusion contacting a portion of the base of the transistor body and a p+ diffusion contacting the remainder of the base of the transistor body. The proportion of n+ and p+ area at the base of the silicon pillar depends on the overlay of the opening to the butted junction. Gate oxide is grown over the entire pillar and a polysilicon gate material is then deposited and etched to form the transistor gate. After fabrication, the entire surface of the device can be planarized by using any standard Chemical Mechanical Planarization (CMP) process.

BRIEF DESCRIPTION OF DRAWINGS

The preferred embodiments of the present invention will hereinafter be described in conjunction with the appended drawings, where like designations denote like elements, and:

FIGS. 7A–8C are a top and sectional views of the semiconductor wafer of FIG. 6 with a block mask in place;

FIGS. 8A–8C are a top and sectional views of the semiconductor wafer of FIG. 7 with the block mask removed and after the insulating material has been etched using a reactive ion etch process;

FIGS. 10A–10C are a top and sectional views of the semiconductor wafer of FIG. 9 after formation of nitride spacers;

FIGS. 12A–12C are a top and sectional views of the wafer structure of FIG. 11 after the contact studs have been fabricated and the vertical MOSFET is substantially completed;

BEST MODE FOR CARRYING OUT THE INVENTION

According to the present invention, an improved method for creating vertical integrated circuit devices, such as Metal Oxide Semiconductor Field Effect Transistors (MOSFETs) is disclosed. By using the present invention, a single crystal pillar body is created over a butted junction of N+ and P+ diffusions. A body contact formed during the fabrication process connects the transistor body to the substrate. A specific preferred embodiment of the present invention for a typical semiconductor device follows. It should be noted that the area shown in the figures described below represents only a small portion of a typical 8" semiconductor wafer. In addition, it should also be noted that the method of the present invention may be successfully implemented with any size of wafer used now or in the future by those skilled in the art.

DETAILED DESCRIPTION

The following figures illustrate the process for fabricating a vertical transistor with a body contact according to a preferred embodiment of the present invention.

Figure 1A:
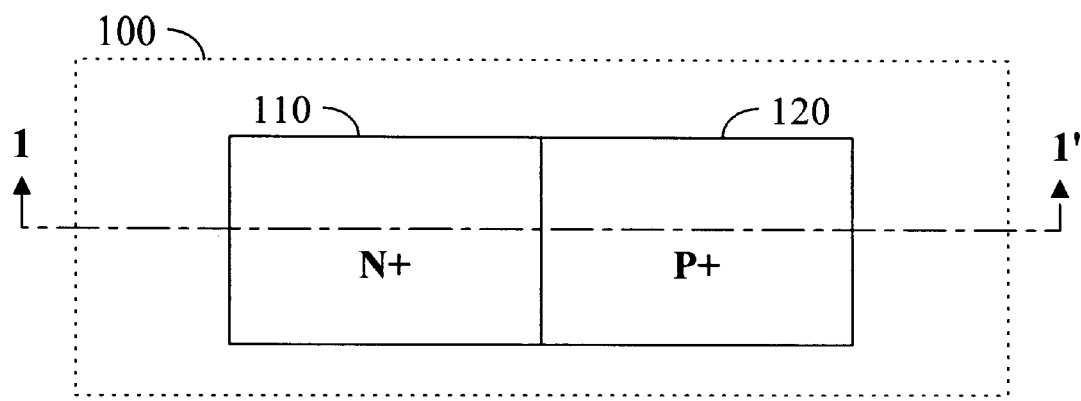
FIGS. 1A–1B are top and sectional views of a semiconductor wafer ready for use with a preferred embodiment of the method of the present invention.
Figure 1B:
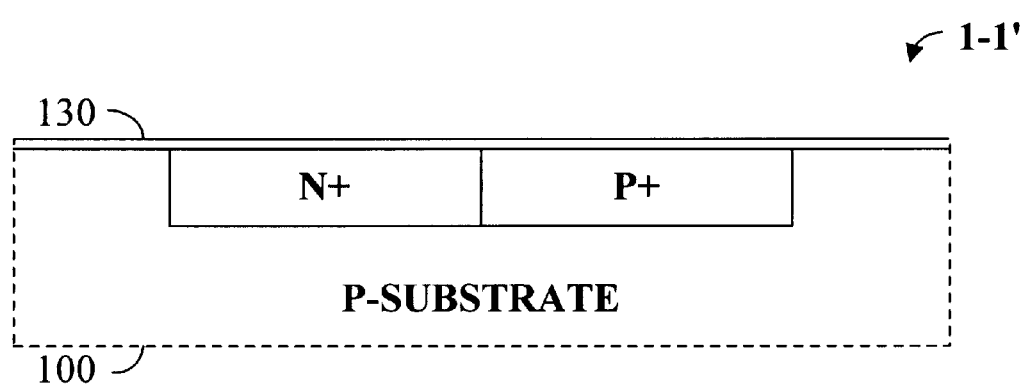

Referring now to FIGS. 1A–1B, a portion of a substrate 100 suitable for use with a preferred embodiment of the present invention is shown. Substrate 100 may be any conventional silicon bulk type or an SOI wafer. For the purpose of illustrating this embodiment, an industry standard p-type (typically a $1\times10^{16}$ cm$^{-3}$) silicon substrate is assumed, however, those skilled in the art will recognize that any other suitable substrate may be used.

As shown in FIGS. 1A–1B, N+ region 110 and P+ region 120 are abutting diffusion regions that have been fabricated in substrate 100. Regions are 110 and 120 may be formed by any two step mask photolithographic process known to those skilled in the art. For example, N+ region 110 and P+ region 120 may be formed by ion implant methods or by using gaseous or solid diffusion sources. Additionally, as shown in sectional view 1—1, a thin sacrificial oxide layer 130 may be grown or deposited over the surface of substrate 100 prior to the formation of N+ region 110 and P+ region 120. Sacrificial oxide layer 130 is a screen oxide through which the ion implant is made and serves to protect the surface of substrate 120 from crystal damage during the ion implant process. If ion implantation techniques are not used to form N+ region 110 and P+ region 120, sacrificial oxide layer 130 may not be necessary. After N+ region 110 and P+ region 120 have been formed, any portion of sacrificial oxide layer 130 remaining on the surface of substrate 100 is stripped by etching the surface of substrate 100 by using an etching process of fluorine chemistry (i.e., HF).

Figure 2A:
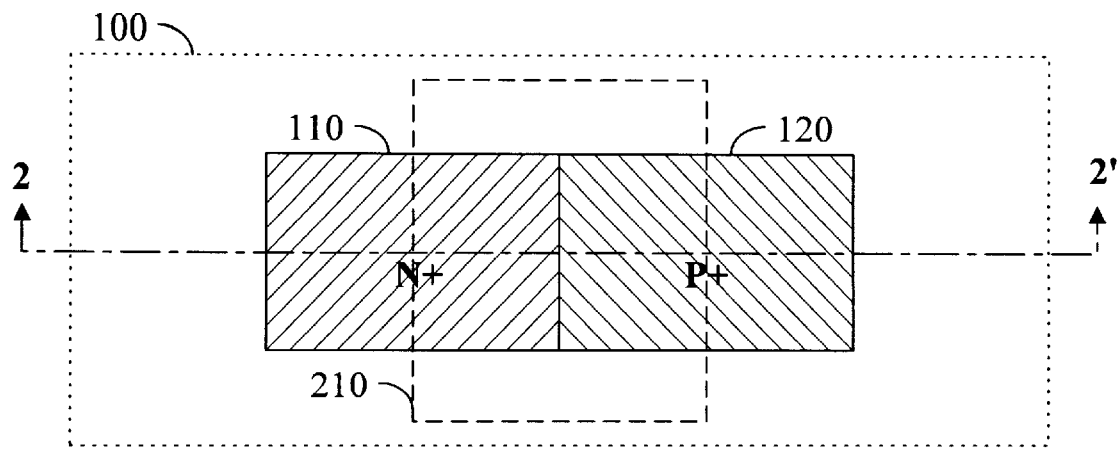
FIGS. 2A–2B are a top and sectional views of the semiconductor wafer of FIG. 1 after formation of the pad nitride and after development of the overlying photoresist layer.
Figure 2B:
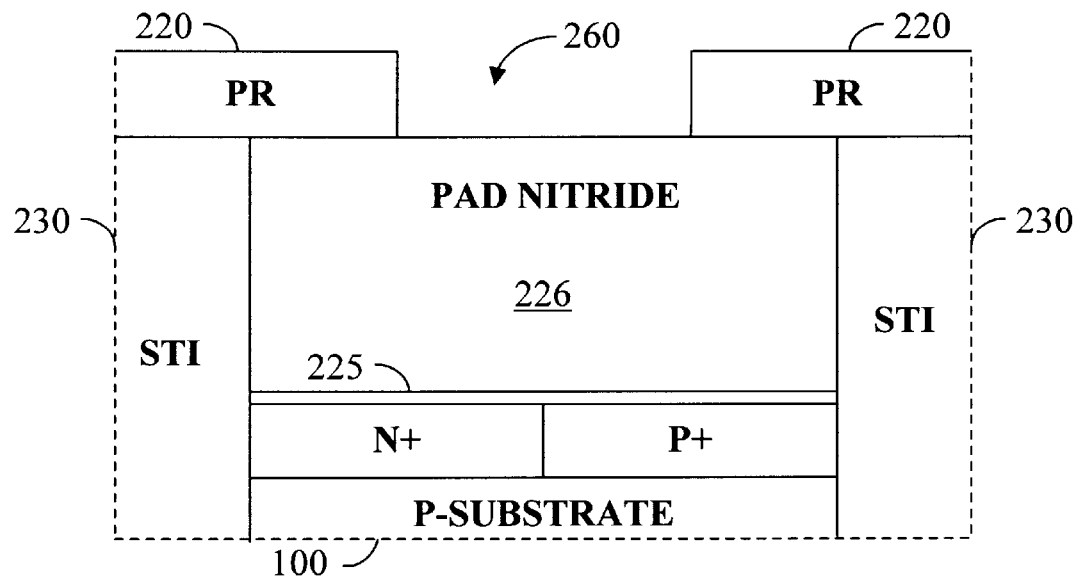

Referring now to FIGS. 2A–2C, including sectional view 2—2; a pad structure 260 is formed over a portion of substrate 100. Pad structure 260 consists of a thin layer (5–10 nm) of oxide 225 and a thick layer (0.20–2.0 $\mu$m) of pad nitride 226. Oxide layer 225 is preferably formed by a thermal oxide growth process and is provided for stress relief. Nitride layer 226 is preferably formed by Chemical Vapor Deposition (CVD) processes and is used to mask portions of substrate 100, including N+ region 110 and P+ region 120. A layer of photoresist is deposited and patterned to define the active areas. Oxide layer 225 and pad nitride layer 226 are etched to create openings to the surface of substrate 100 outside of the active areas. Next, the exposed surface of substrate 100 is recessed. CVD oxide (STI) is deposited and planarized. This forms islands of active area surrounded by STI regions 230. STI regions 230 serve as isolation barriers to electrically isolate the MOSFET devices subsequently formed in the active area of substrate 100 from each other. STI regions 230 has been planarized by a CMP process so that the uppermost surfaces of STI regions 230 are coplanar with the top surface of pad nitride 226.

As shown in FIGS. 2A–2B, the active areas are now surrounded by shallow trench isolation (STI) regions 230. As shown in sectional view 2–2' of FIGS. 2A–2B, a photoresist (PR) mask 220 is then used to define the regions of substrate 100 which will later contain the silicon pillar of the vertical MOSFETs of the preferred embodiments of the present invention. Note that opening 210 in photoresist layer 220 defines an opening which is used to etch a hole through oxide 225 and pad nitride 226 down to the surface of butted N+ region 110 and P+ region 120. Photoresist mask 220 also overlaps STI regions 230.

Using a reactive ion etch process, pad nitride layer 226 is exposed to an etchant through the opening in photoresist mask 220 and the etchant selectively removes exposed portions of pad nitride 226. Pad nitride 226 is etched down to oxide 225. This creates an opening or hole in pad nitride 226. As a result of the selective nitride etch to oxide 225, the edge of the opening created in pad nitride 226 is vertically self aligned to the edge of the active area. The advantage of this self alignment procedure is that the active area width may be a minimum feature size while still fully landing the silicon pillar on the active area. This means that no part of the subsequently created silicon pillar will overlap STI regions 230 outside of the active areas. Using this technique allows for increased device density. If this self-alignment process is not used, a portion of the silicon pillar might overlap the isolation region. This, in turn, would require wider isolation regions along with an accompanying device density penalty. In addition, a non-self-aligned process requires a timed etch process to avoid etching into STI regions 230 below the top surface of the silicon. As will be seen later, using a preferred embodiment of the present invention, no part of the final pillar transistor will overlap STI regions 230. More details regarding the creation of self-aligned pillars are presented below in conjunction with FIGS. 14A–16C.

Figures 3A, 3B:
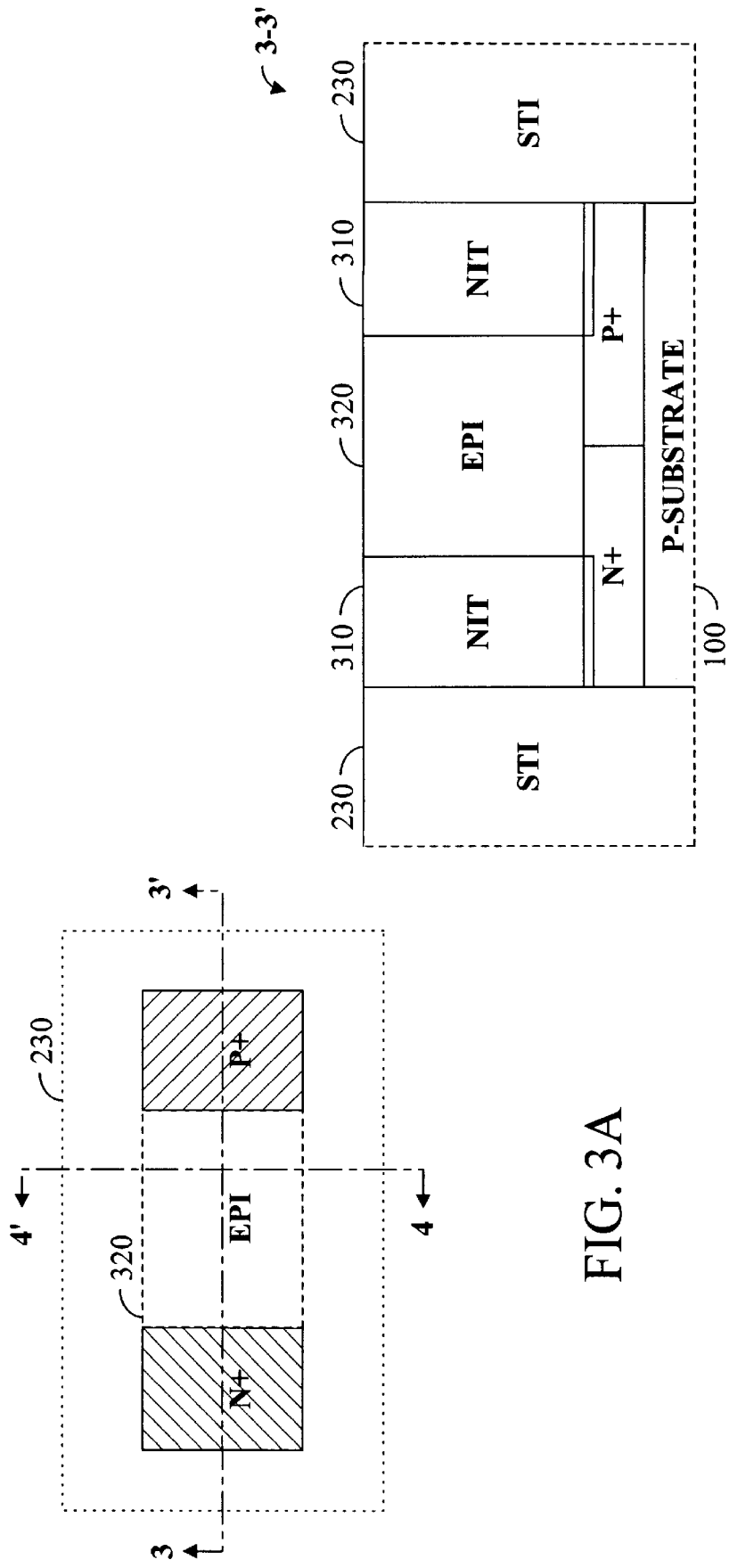
FIGS. 3A–3B are a top and sectional views of the semiconductor wafer of FIG. 2 after growth of the epitaxial silicon pillar.
Figure 3C:
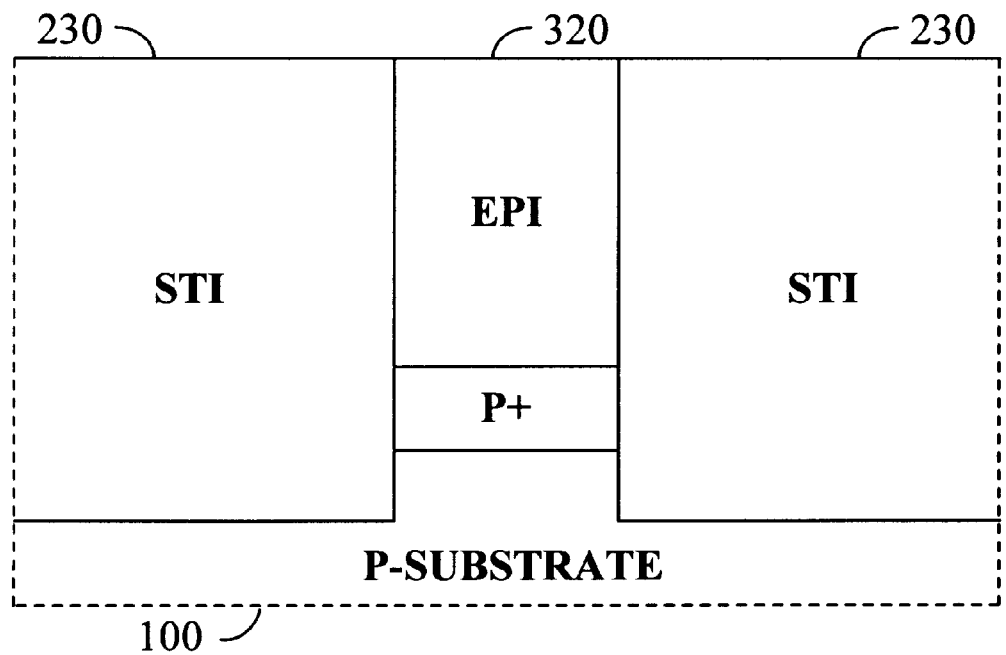

Referring now to FIGS. 3A–3C and sections 3–3' and 4–4', any pad oxide 225 remaining at the bottom of the hole is etched out. This operation will also remove a small amount of oxide from the surface of STI regions 230. This is of no practical consequence, since STI region 230 is very thick relative to the thickness of oxide removed. After removal of oxide 225, photoresist mask 220 is removed by a photoresist etchant. Next, using a selective growth technique, a pillar of silicon 320 (EPI) is grown vertically in the hole until the top of silicon pillar 320 is above the surface of the surrounding nitride 310 and STI regions 230. The selective epitaxial growth avoids the nucleation of silicon on the vertical sidewalls of the hole, thus assuring device quality single crystal silicon will be formed in the hole. Although epitaxial growth is the most preferred method of forming silicon pillar 320, any other suitable method of creating a silicon pillar (i.e., annealing a polycrystalline silicon) may be used. During the epitaxal growth process, the silicon in pillar 320 may be in-situ doped to establish the channel doping of the MOSFET (i.e., n-channel doping or p channel doping). Alternatively, the doping may be intentionally very light, to enhance the selectivity of the epitaxial growth process. In that case, the channel doping will be defined later during a subsequent ion implant step. The top surface is then planarized with a standard CMP process, such that the top of silicon pillar 320 and the surrounding nitride 310 and STI regions 230 are coplanar as shown in FIGS. 3A–3C.

Figure 4B:
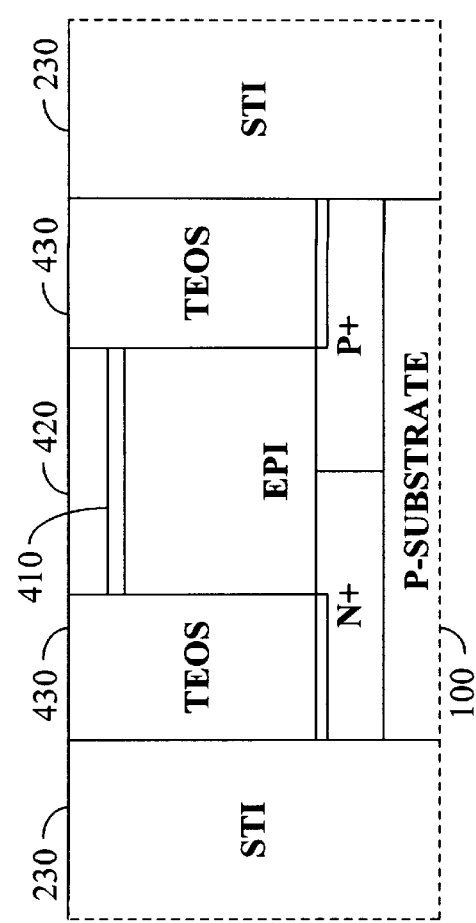
FIGS. 4A–4C are a top and sectional views of the semiconductor wafer of FIG. 3 with a nitride cap formed in place over the silicon pillar.
Figure 4A:
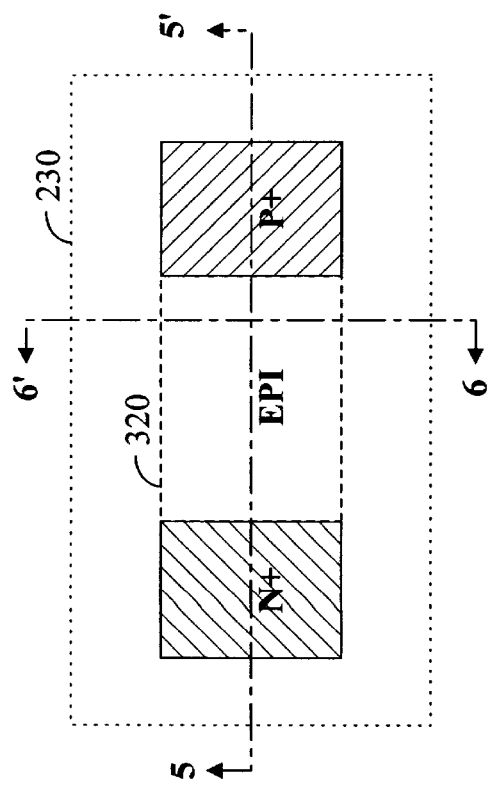
Figure 4C:
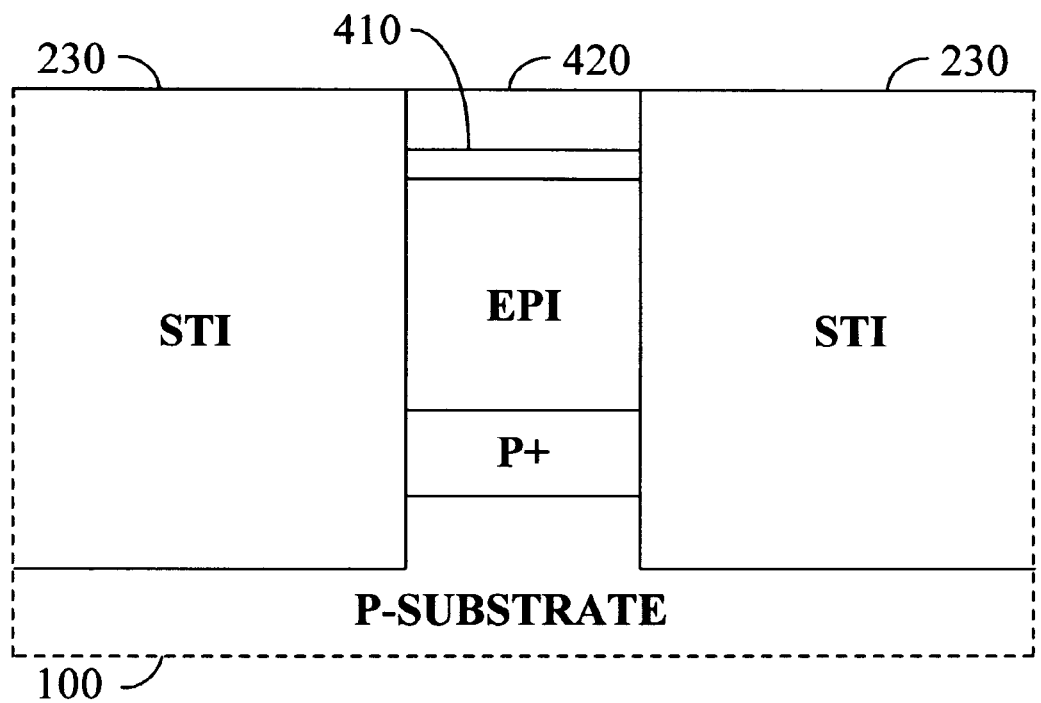

Referring now to FIGS. 4A–4C and sections 5–5' and 6–6', nitride 310 is selectively etched relative to silicon and oxide. The resulting gap between the silicon pillar 320 and STI regions 230 is then filled with a CVD oxide such as Tetra-Ethyl-Ortho-Silicate (TEOS) 430 and planarized with a standard CMP process to allow the subsequent formation of a nitride cap which will be self-aligned with the top of silicon pillar 320. Next, the top of silicon pillar 320 is recessed below the surface of STI regions 230 by using a silicon etch which is selective relative to oxide.

In the case of a vertical NMOSFET, a p-type ion implant process, using boron or other suitable donor species, is used to establish the channel doping of an n-channel device. Preferably, this is a very light doping, relative to the source/drain doping. Doping concentrations for the channel of the NMOSFET may typically range from $5 \times 10^{15} – 2 \times 10^{18}$ cm$^{-3}$. The doping concentrations for the channel of a PMOSFET would be similar to the doping concentrations for an NMOSFET and would be accomplished by implanting an n-type species, preferably phosphorous or arsenic. As explained earlier, this doping step may be omitted if in-situ doping was used during pillar growth. The thick oxide layer masks the region adjacent to silicon pillar 320 from the implant.

A shallow N+ region 410 is created. It is important to note that this could be a P+ region in the case of fabricating a PMOS device. N+ region 410 is created by using an appropriate implant material, preferably arsenic, although phosphorus may also be used and is formed by implanting into the top of silicon pillar 320. The peak doping concentrations range from $1 \times 10^{19} – 1 \times 10^{21}$ cm$^{-3}$ and the implant energy is selected such that the peak of the implant falls near the top silicon surface. The preferred energy levels are 15–30 KeV for arsenic and 5–20 KeV for phosphorous. In addition, prior to the N+ implant, a thin (5–15 nm) layer of screen oxide is grown on the top surface of pillar 230 to protect the silicon from implant damage. N+ region 410 will later form one of the source/drain regions of the MOSFET. A layer of nitride 420 (i.e., a nitride cap) is then deposited and the surface of nitride layer 420 is planarized to the level of the surrounding surfaces as shown in FIGS. 4A–4C. Although the doping is accomplished by implant techniques, other suitable doping methods known to those skilled in the art, including using gaseous sources, may also be used.

Figure 5B:
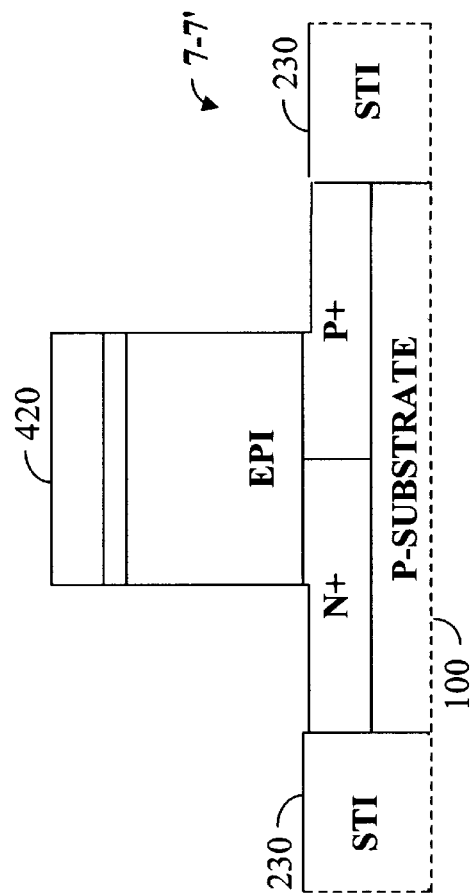
FIGS. 5A–5C are a top and sectional views of the semiconductor wafer of FIG. 4 after being exposed to a reactive ion etch.
Figure 5A:
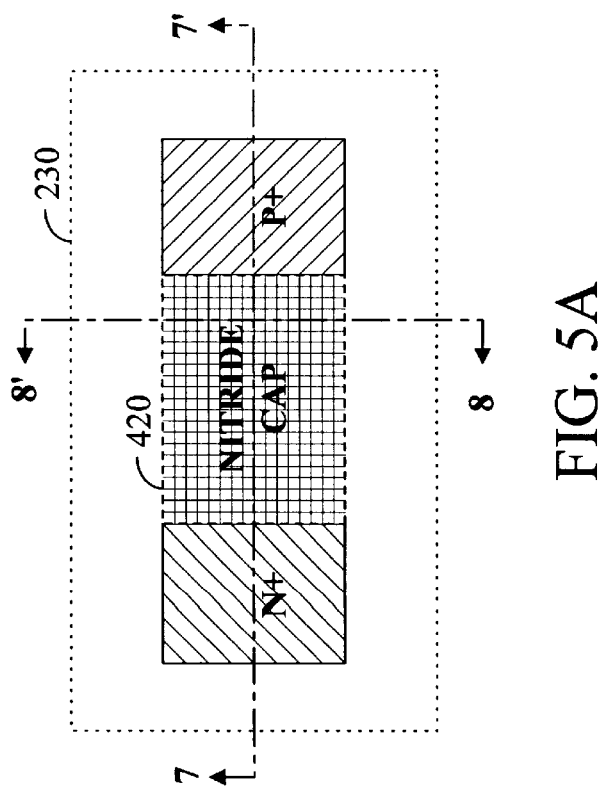
Figure 5C:
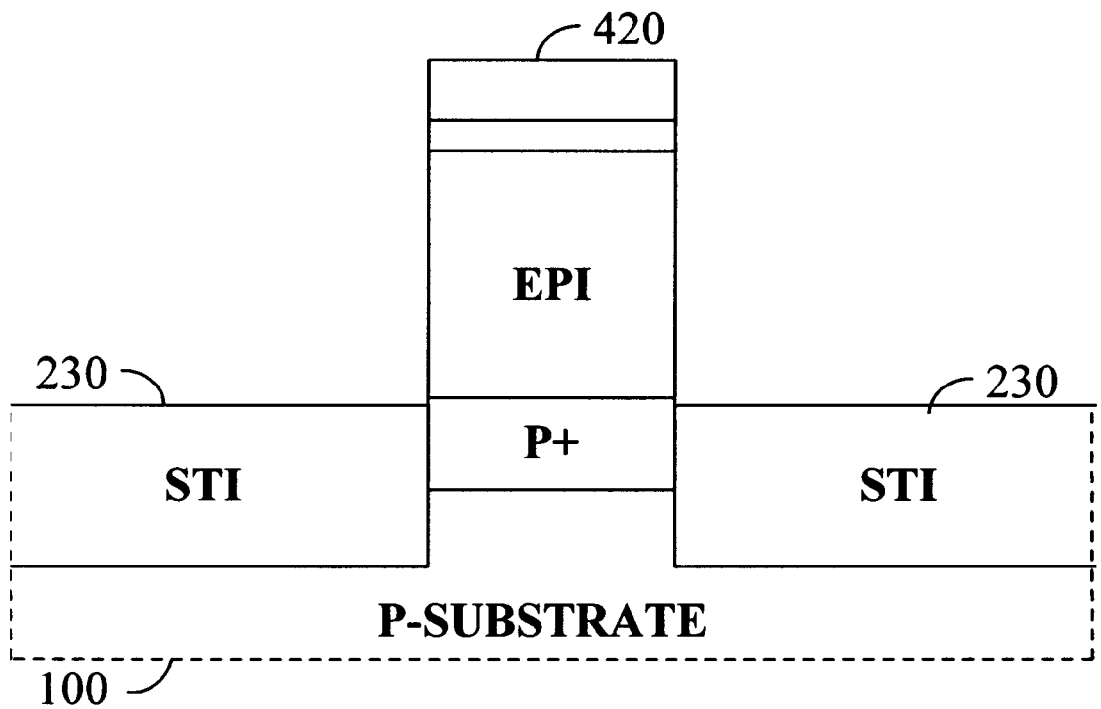

Referring now to FIGS. 5A–5C and sections 7–7' and 8–8', both STI regions 230 and TEOS regions 430 are then selectively etched so as to be recessed to the base of silicon pillar 320 as shown. The oxide is removed by using a timed reactive ion etch process, where the etchant is selective to nitride, leaving the structure substantially as shown in FIGS. 5A–5C. Note that the depth of the etch is controlled by the timing of the etch process. Nitride cap 420 serves to protect silicon pillar 320 from being etched away in subsequent process steps.

Figure 6B:
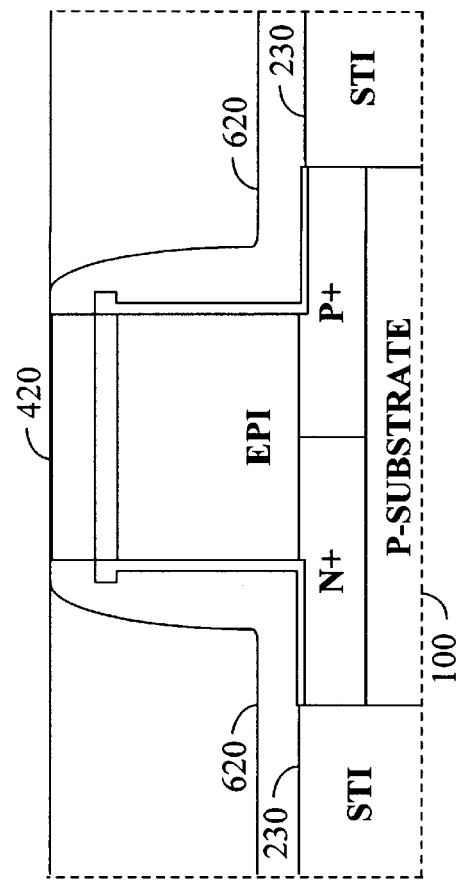
FIGS. 6A–6C are a top and sectional views of the semiconductor wafer of FIG. 5 after deposition of a gate conductor material.
Figure 6A:
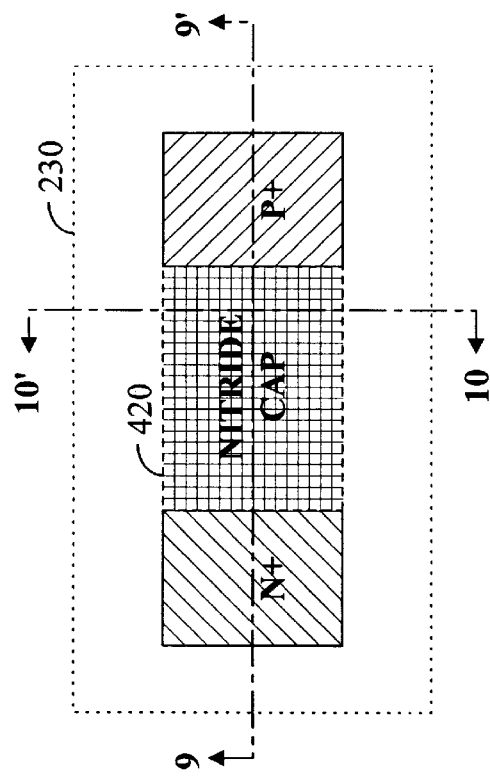
Figure 6C:
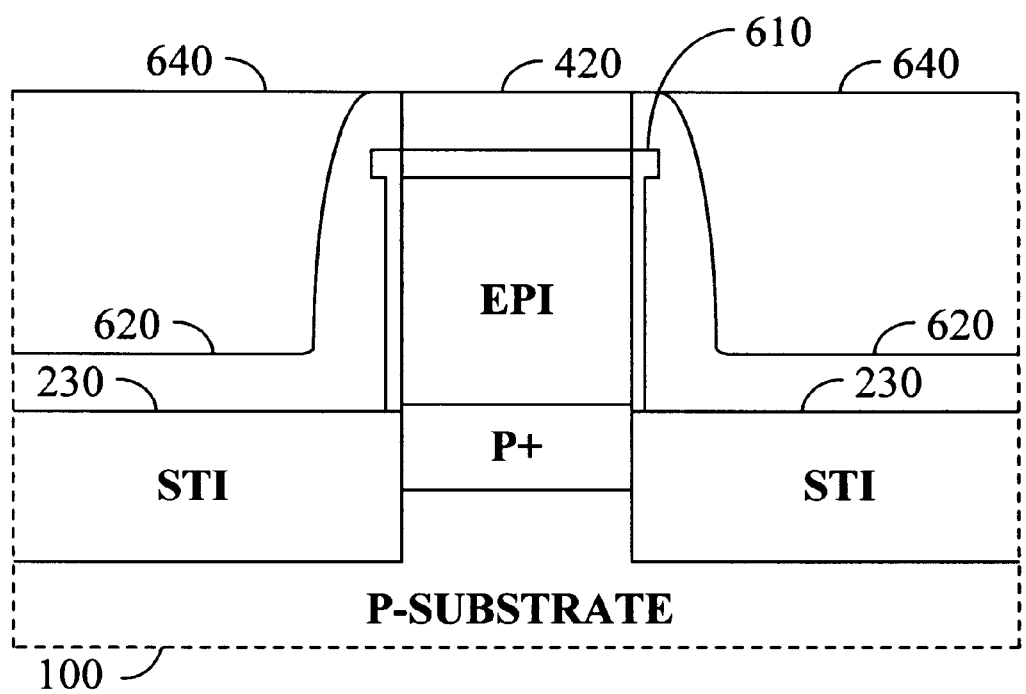

Referring now to FIGS. 6A–6C and sections 9–9' and 10–10', a gate oxide 610 is then grown on the exposed silicon surfaces using a thermal growth process. Alternatively, an oxynitride gate insulator or some other suitable insulator material may be deposited. Due to the differential oxidation rate between lightly doped channel region and highly doped silicon source/drain regions, the oxide over the N+ and the P+ surfaces grows significantly thicker than the oxide over the channel region (the differential ratio can be as large as 10:1). This effect is exploited to obtain reduced gate to diffusion (i.e., source/drain diffusions) overlap capacitance, which, in turn, enhances device performance by way of providing faster switching speeds and in applications involving fan-out with a single device driving multiple other devices.

A layer of gate conductor material 620 is then conformally deposited over the surface. Gate conductor material 620 may consist of highly doped polysilicon, a composite of highly doped polysilicon and silicide (e.g. tungsten silicide, titanium silicide, or cobalt silicide), or a metal such as tungsten or aluminum. While any of these materials are suitable as a gate conductor material, it is most preferable to use polysilicon clad by suicide.

After gate oxide 610 and conductor material 620 are in place, a thick layer of CVD oxide 640 is deposited. While TEOS is the preferred material for oxide 640, materials other than TEOS may be used. These alternate material may include boron nitride or organic polymers such as polyimide. These materials will later be etched using an etchant which is selective to gate conductor material 620. The entire surface of substrate 100 is then planarized by a CMP process until it is level with the top of nitride cap 420 as shown in FIGS. 6A–6C.

Figures 7A, 7B:
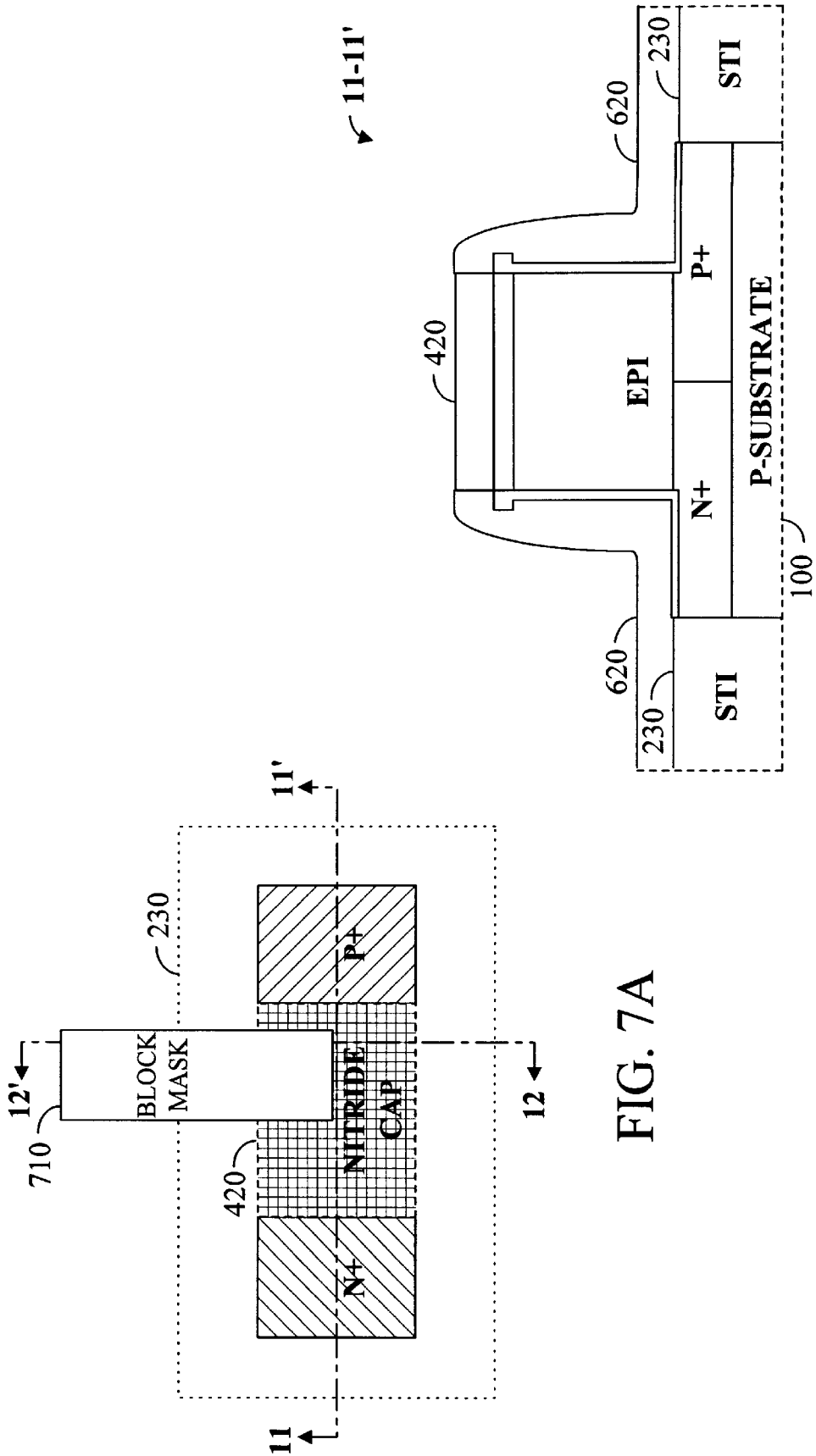
Figure 7C:
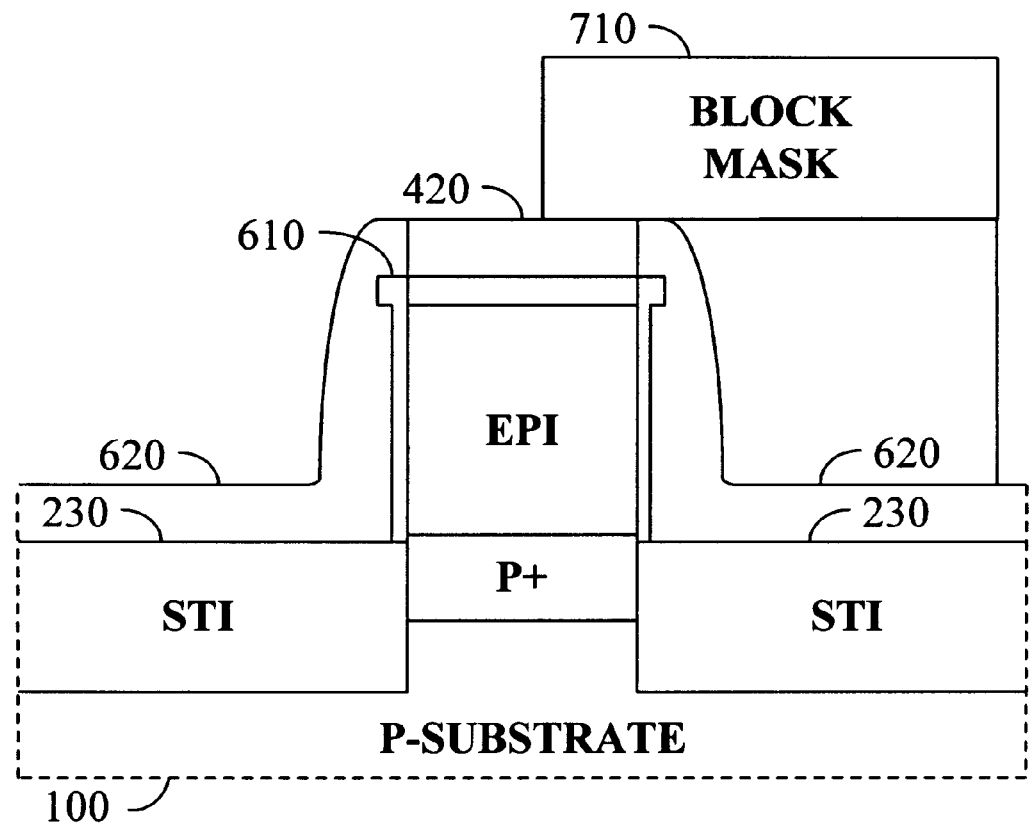
Figure 8B:
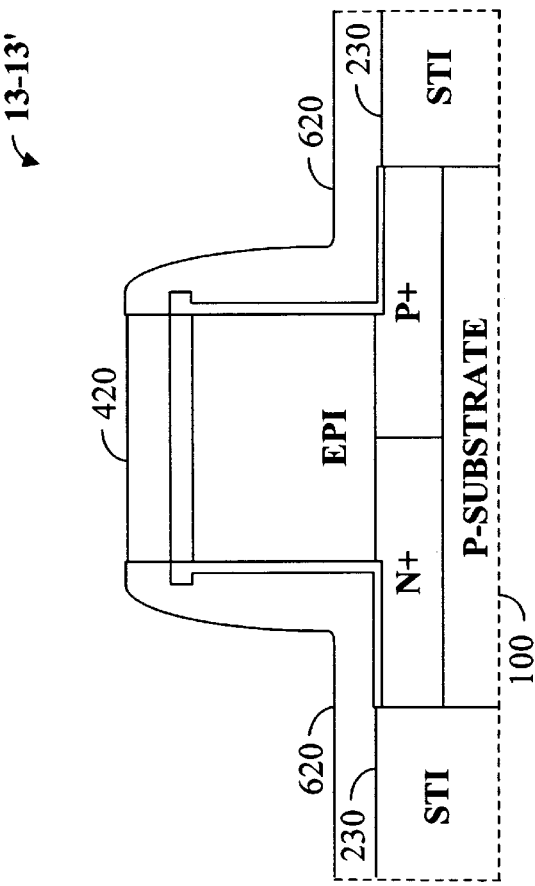
Figure 8A:
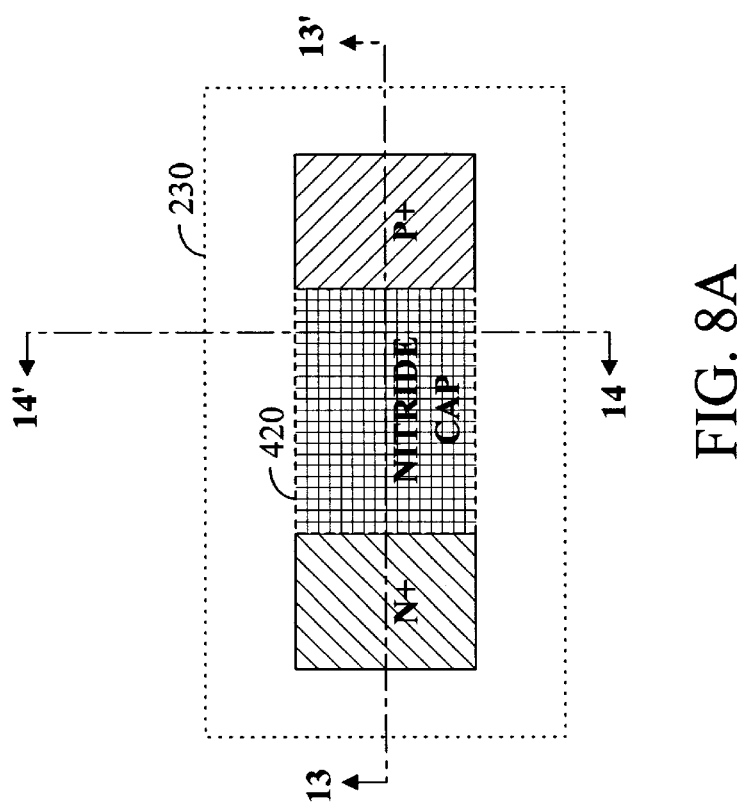
Figure 8C:
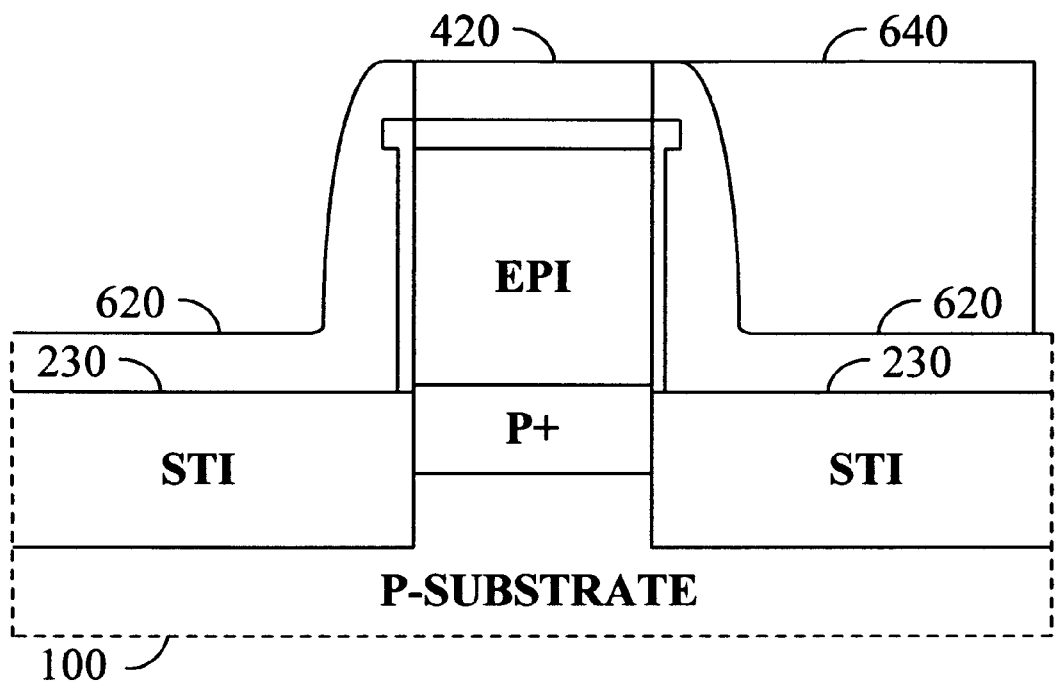

Referring now to FIGS. 7A–7C and sections 11–11' and 12–12', a block mask 710 is deposited and then patterned over the surface of substrate 100. Block mask 710 may be formed from any standard photoresist material or other mask material which can resist a subsequent oxide etch. Generally, any material which can resist the etchant for oxide 640 will be suitable for use as block mask 710. Block mask 710 serves to define the area for the contact to gate conductor material 620. The areas of oxide 640 not protected by block mask 710 are then etched to the surface of the gate conductor using a reactive ion etch process with an etchant which is selective to gate conductor material 620. Block mask 710 is then removed, leaving the structure substantially as shown in FIGS. 8A–8C sections 13–13' and 14–14'. Block mask 710 is removed by standard photoresist strippers, or etchants which remove block mask 710 without damaging any underlying or adjacent areas.

Figures 9A, 9B:
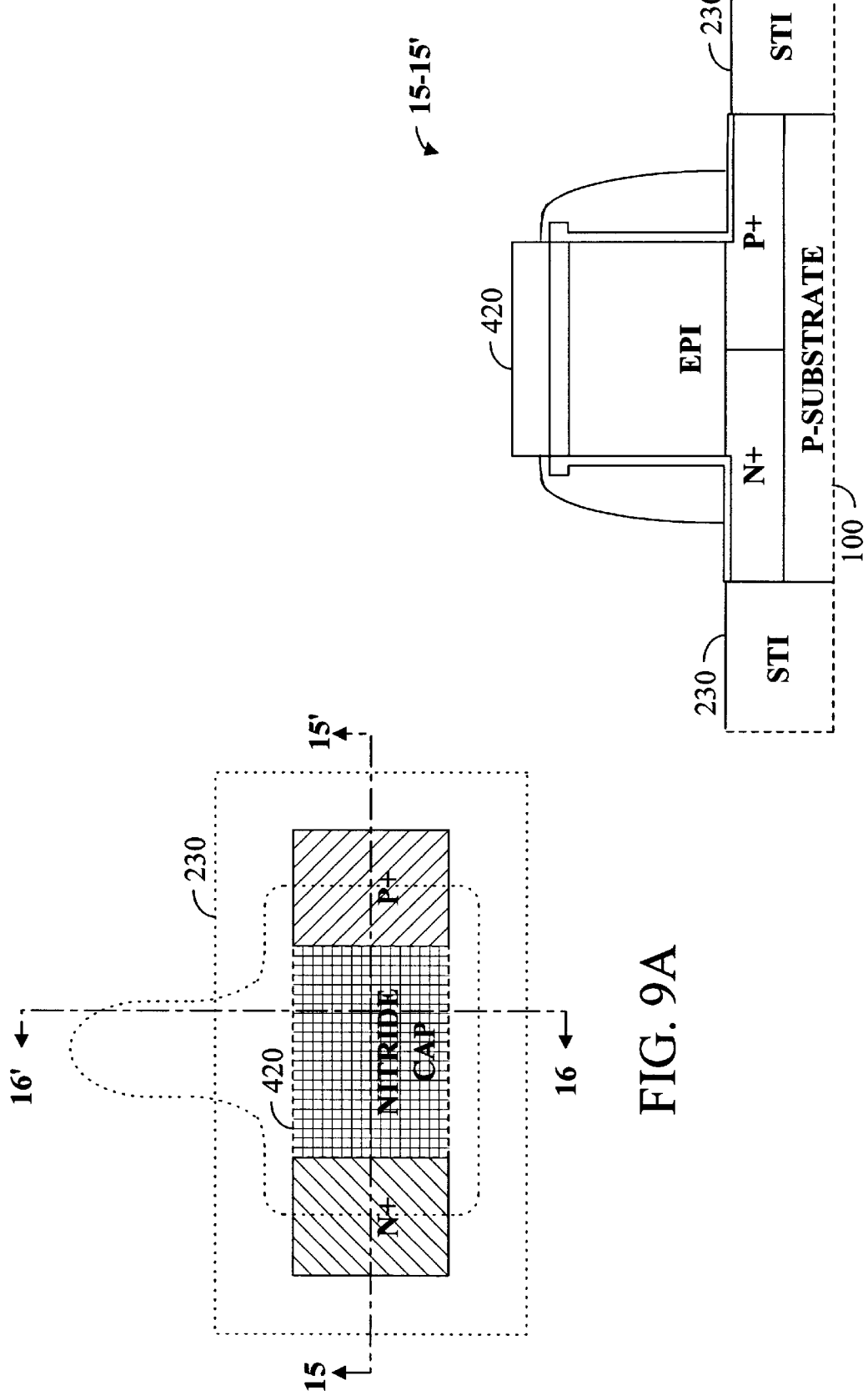
FIGS. 9A–9C are a top and sectional views of the semiconductor wafer of FIG. 8 after the gate conductor material has been etched by a reactive ion etch process.
Figure 9C:
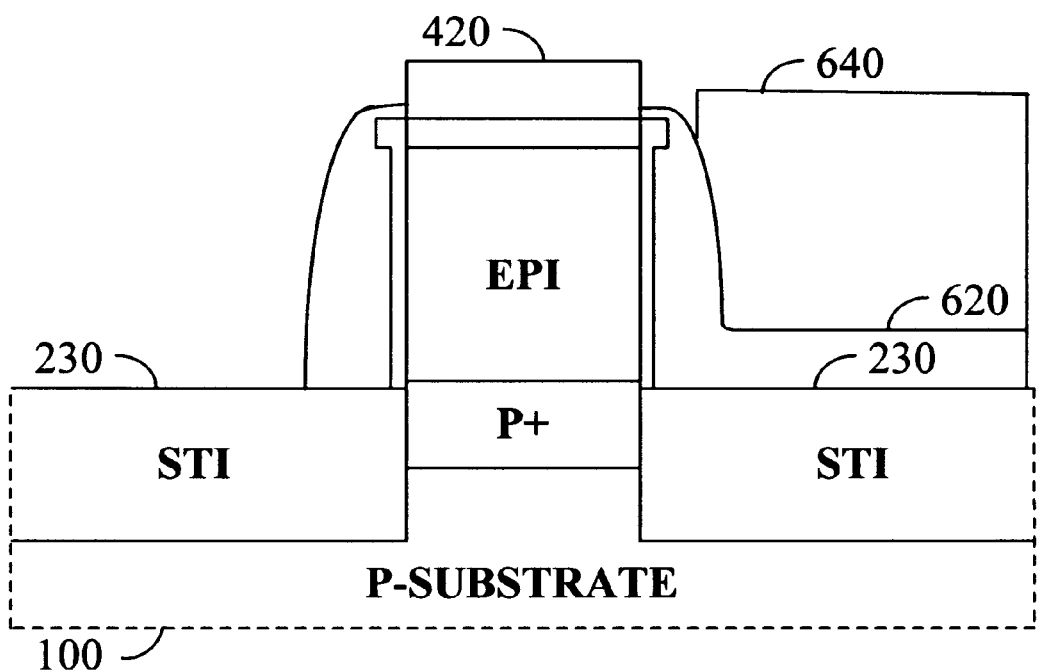

Referring now to FIGS. 9A–9C and sections 15–15' and 16–16', the exposed surface of gate conductor material 620 not protected by oxide 640 is etched with a reactive ion etch process using an etchant which is selective to oxide, nitride, and the alternative material (boron nitride or organic polymers, etc., if used). Due to the nature of the reactive ion etch process, the top surface of the oxide 640 is eroded slightly. This erosion occurs because the etchant used in the reactive ion etch process is not perfectly selective and reacts somewhat with the material that is to remain. In addition, some erosion takes place due to "sputtering" caused by the energetic etchant molecules. This erosion effect is used to advantage, as will be seen later in the process. If a material other than TEOS is used for oxide 640, it is now removed with a selective etchant relative to oxide and gate conductor material 620.

Figure 10C:
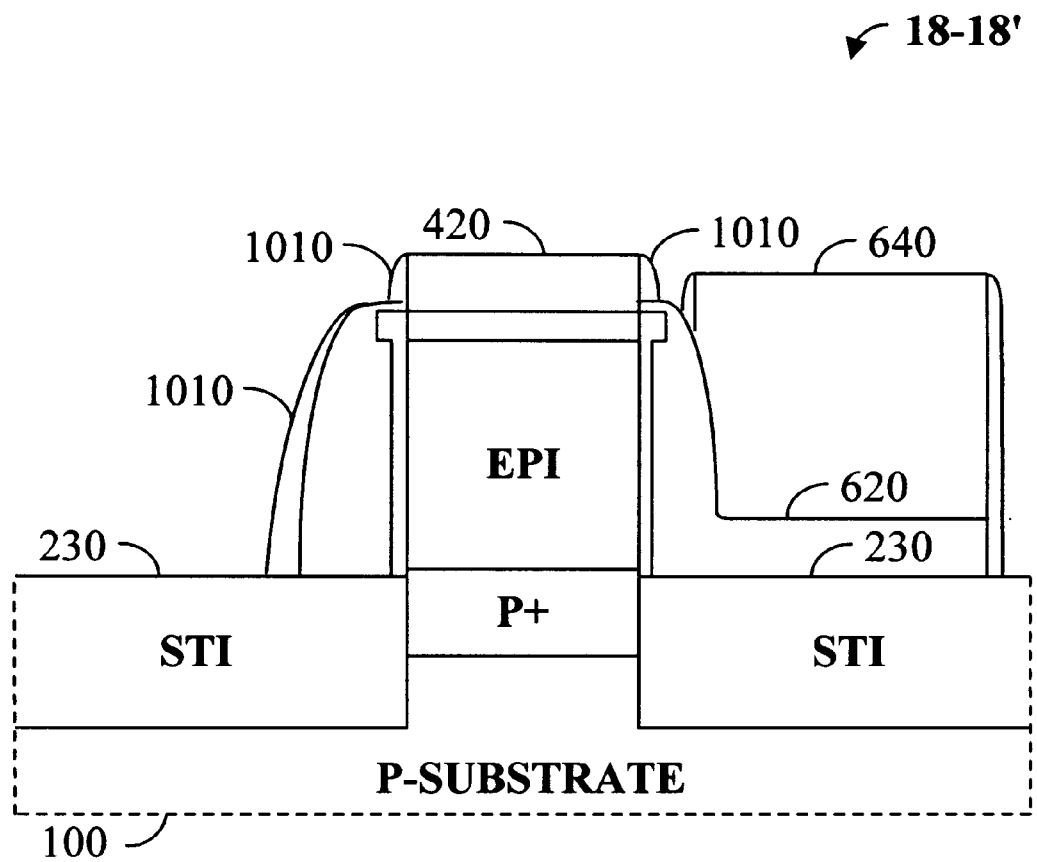

Referring now to FIGS. 10A–10C and sections 17–17' and 18–18', nitride spacers 1010 are then formed on the exposed vertical surfaces via a CVD deposition process followed by an etching process. To form nitride spacers 1010, a conformal nitride barrier layer is deposited and then selectively etched using a directional reactive ion etch process as discussed above in relation to FIGS. 9A–9C, thereby forming nitride spacers 1010. Nitride spacers 1010 provide an electrical isolation or separation between gate conductor material 620 and the metal contact studs which will be formed in a subsequent process step.

Figures 11A, 11B:
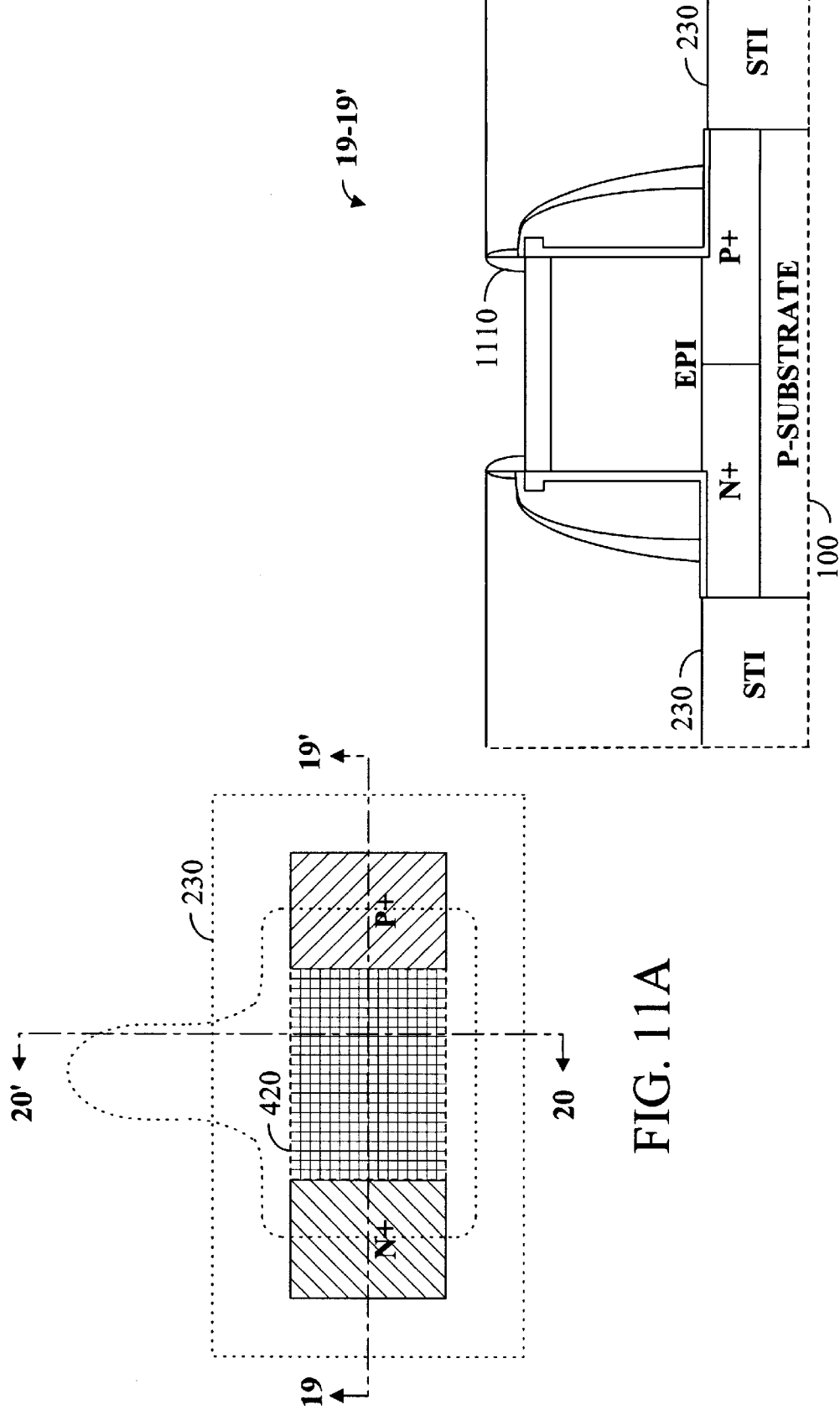
FIGS. 11A–11C are a top and sectional views of the semiconductor wafer of FIG. 10 after formation of an insulating layer, removal of the nitride cap, and formation of insulating spacers for borderless contact with the top diffusion.
Figure 11C:
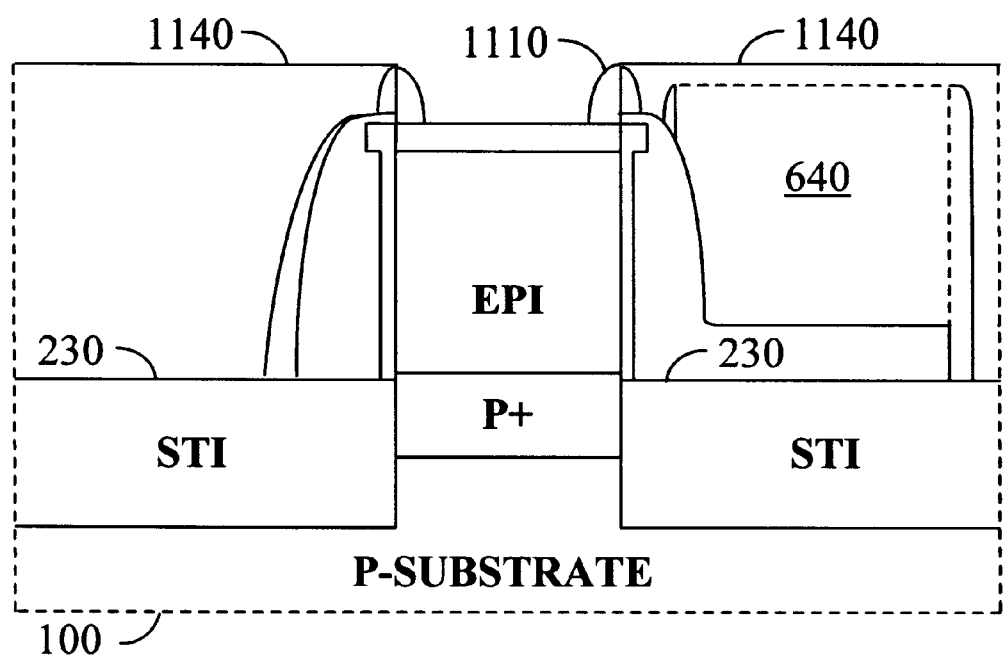

Referring now to FIGS. 11A–11C and sections 19–19' and 20–20', a thick layer of CVD oxide 1140 is deposited and planarized to the top of the nitride cap. Oxide layer 1140 should be thick enough such that the lowest point on the surface of oxide 1140 is above the top surface of nitride cap 420. The exposed nitride cap 420 is then removed with a selective etch process, using an etchant which is selective to the surrounding materials. Another thin layer of nitride is subsequently deposited and etched as explained above in conjunction with nitride spacers 1010, thereby forming nitride spacers 1110 as shown in FIGS. 11A–11C.

Figure 12C:
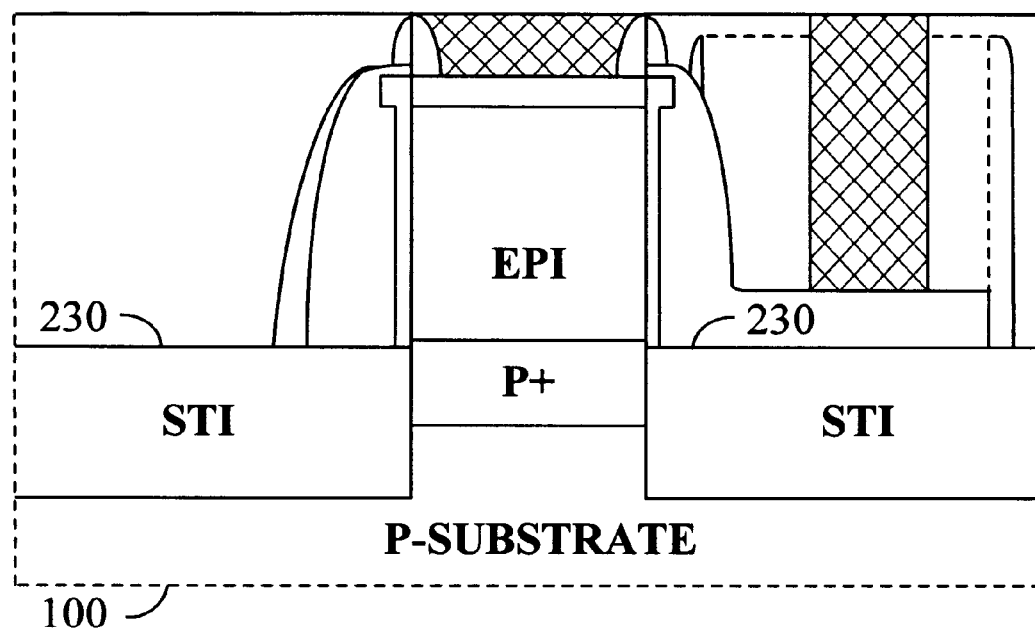

Then, a layer of photoresist mask material is deposited and patterned for subsequent formation of vias which will be filled with metal to form contact points (i.e., studs or tabs) for the source/drain diffusions, the gate, and the body contact. The vias for the gate and diffusion contact studs are etched through the TEOS and any remaining pad oxide material. This oxide etch process is a selective directional etch which will not etch the nitride, silicon, silicide, polysilicon or gate metal. The next step is a CVD process whereby metal (preferably tungsten) is deposited over the surface, filling the open vias. The entire surface is then planarized, using a CMP process, leaving the structure substantially as shown in FIGS. 12A–12C. As shown in FIGS. 12A–12C and sections 21–21' and 22–22', the tungsten has filled the vias and formed gate contact stud 1210, bottom source/drain contact stud 1220, top source/drain contact stud 1230, and body contact stud 1240. The direction of the major electron flow as shown in FIGS. 12A–12C indicates that the source is at the bottom N+ diffusion and the drain is the top N+ diffusion.

Figure 13:
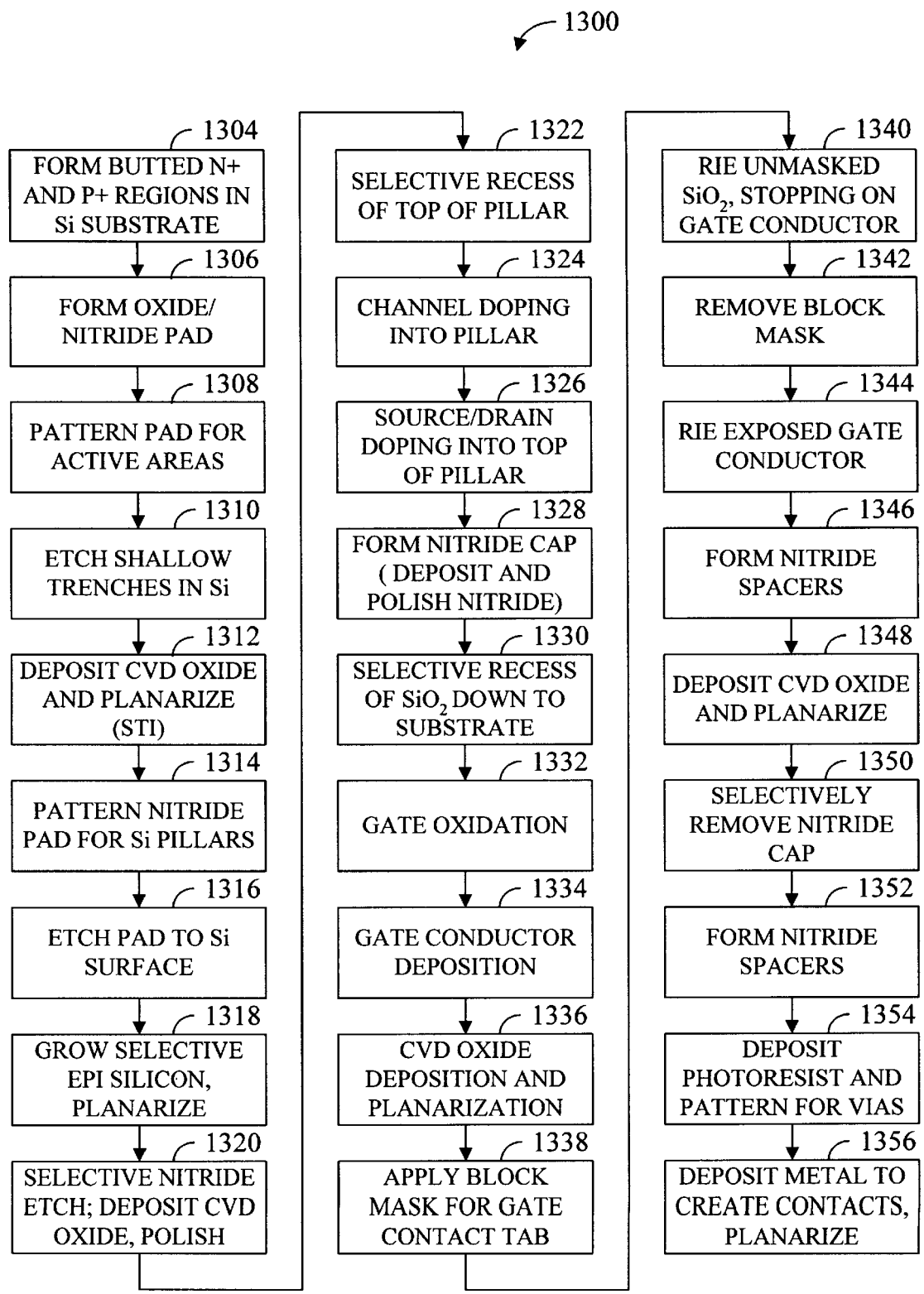
FIG. 13 is a flow chart of a method for fabricating vertical transistors according to a preferred embodiment of the present invention.

Referring now to FIG. 13, a method 1300 for fabricating a vertical pillar transistor according to a preferred embodiment of the present invention is shown. Method 1300 generally parallels the steps described above.

First, a butted junction is formed with an N+ diffusion and a P+ diffusion (step 1304). This butted junction will provide one source/drain diffusion and the body contact at the bottom of the pillar.

Next, an oxide layer and a pad nitride layer are formed over the N+ diffusion and the P+ diffusion (step 1306). After the pad nitride layer has been deposited, the nitride layer is patterned to delineate the active areas for the devices to be formed in the subsequent steps (step 1308).

After patterning the nitride layer, shallow trenches are etched into the substrate (step 1310) and CVD oxide is deposited to form STI regions adjacent to the N+ diffusion and the P+ diffusion. Next the oxide is been deposited, the CVD oxide is planarized (step 1312). The STI regions are isolation regions used to separate devices from each other as they are formed in the substrate.

In the next step, the nitride pad is patterned to form openings for growing the silicon pillars (step 1314) and the remainder of the pad is etched to the surface of the substrate (step 1316). Next, using an epitaxial growth process, the silicon pillars are formed and the top of the silicon pillars is then planarized (step 1318).

Once the silicon pillars are in place, a selective nitride etch is applied to remove the remaining pad nitride, CVD oxide is then deposited and polished (step 1320). After the CVD oxide has been polished, the top of the silicon pillar is recessed (step 1322).

Next, the silicon pillar is doped to form the channel (step 1324) and the implant doping is accomplished also for the top source/drain in the silicon pillar (step 1326). As mentioned previously, if the silicon pillar was doped in-situ as part of the growth process, the channel doping step may be eliminated at this juncture. In addition, as is known to those skilled in the art, it may be desirable to use a thin layer of screen oxide as part of the implant process. After the top source/drain diffusion has been formed, a nitride cap is placed over the silicon pillar to protect the silicon pillar from subsequent process steps (step 1328).

At this point, the rest of the $SiO_2$ is recessed down to the level of the surface of the substrate (step 1330), gate oxidation is performed (step 1332), and the gate conductor material is deposited (step 1334). After the gate conductor material has been deposited, a layer of CVD oxide is deposited and planarized to the top level of the nitride cap (step 1336). A block mask is then deposited to form the gate contact tab (step 1338) and a selective reactive ion etch process is used to remove unmasked oxide down to the level of the gate conductor material (step 1340). After the oxide has been removed, the block mask material is stripped away (step 1342) and the gate conductor material is exposed to a reactive ion etch process (step 1344).

Next, a conformal layer of nitride is deposited and etched to form nitride sidewall spacers (step 1346) and another layer of CVD oxide is deposited and planarized (step 1348). After the oxide is planarized, the nitride cap is removed (step 1350) and another set of sidewall spacers are formed on the walls where the nitride cap was (step 1352).

Finally, the topmost oxide layer is patterned to form vias for the contact studs (step 1354), a metal layer is deposited to fill the vias and is then planarized, thereby creating contact studs (step 1356) for contacting the source/drain diffusions and the body contact.

Referring now to FIGS. 2A–2B, FIGS. 14A–16C and sections 23–23' and 24–24', a method for creating self-aligned silicon pillars according to a preferred embodiment of the present invention is described. To achieve maximum device density, it is desirable to minimize the dimensions of the active areas and the spacing between the active areas. For the case of vertical MOSFETs formed on islands of active area considered herein, this means that the bottom end of the vertical MOSFET should span the entire width of the underlying silicon active area, without extending into the neighboring isolation regions. This is achieved by self-registering (or self-aligning) the pillar to the underlying silicon islands.

As shown in FIGS. 2A–2C, islands of silicon active areas are located between STI regions 230. Although illustrated herein as STI regions, the isolation regions may be STI, LOCOS, or any other suitable isolation material and method known to those skilled in the art. Following the definition of the active silicon areas, nitride pad 226 remains in place over the silicon islands.

Figure 14B:
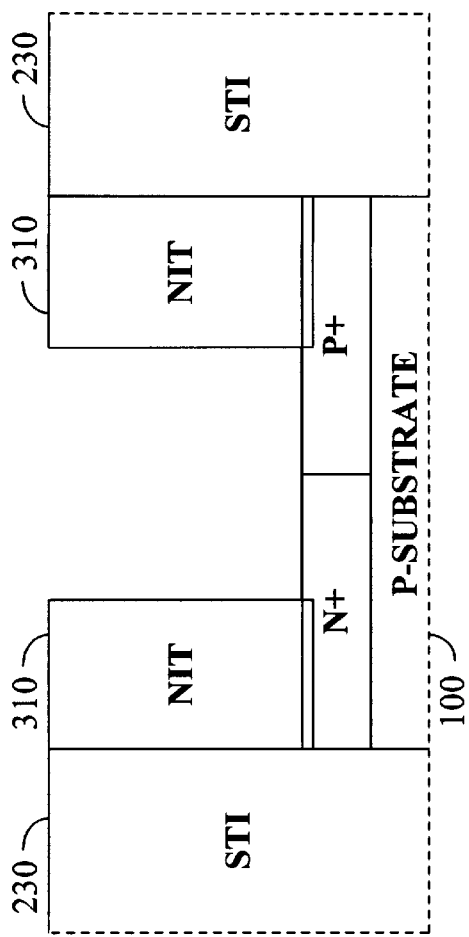
FIGS. 14A–14C are a top and sectional views of the wafer structure of FIG. 2 after etching with a nitride etchant selective to oxide and photoresist.
Figure 14A:
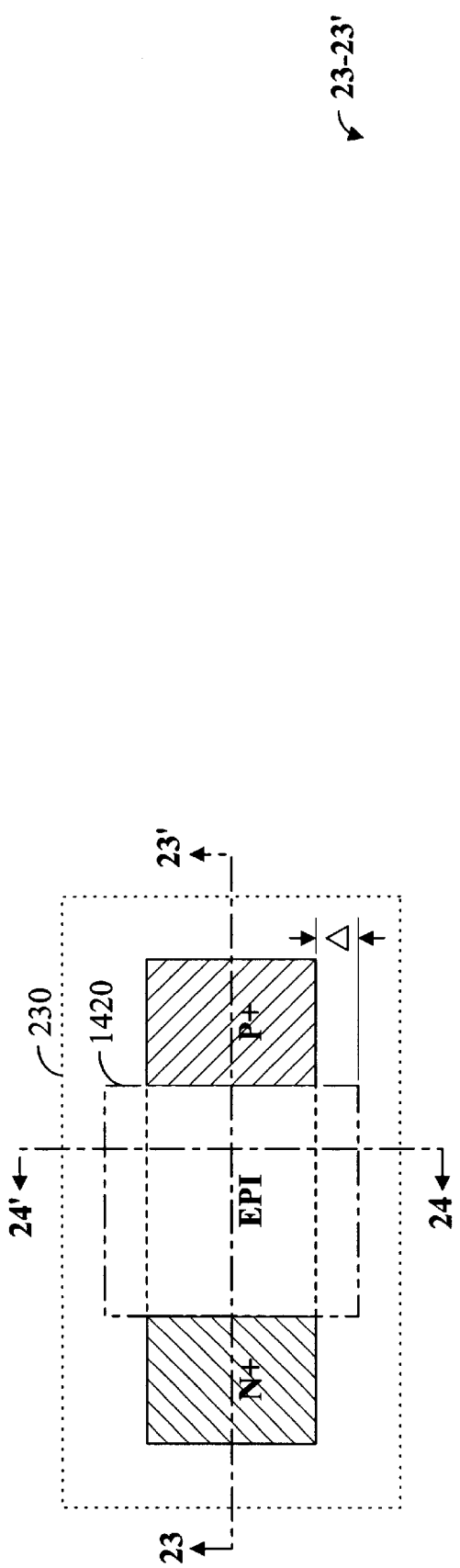
Figure 14C:
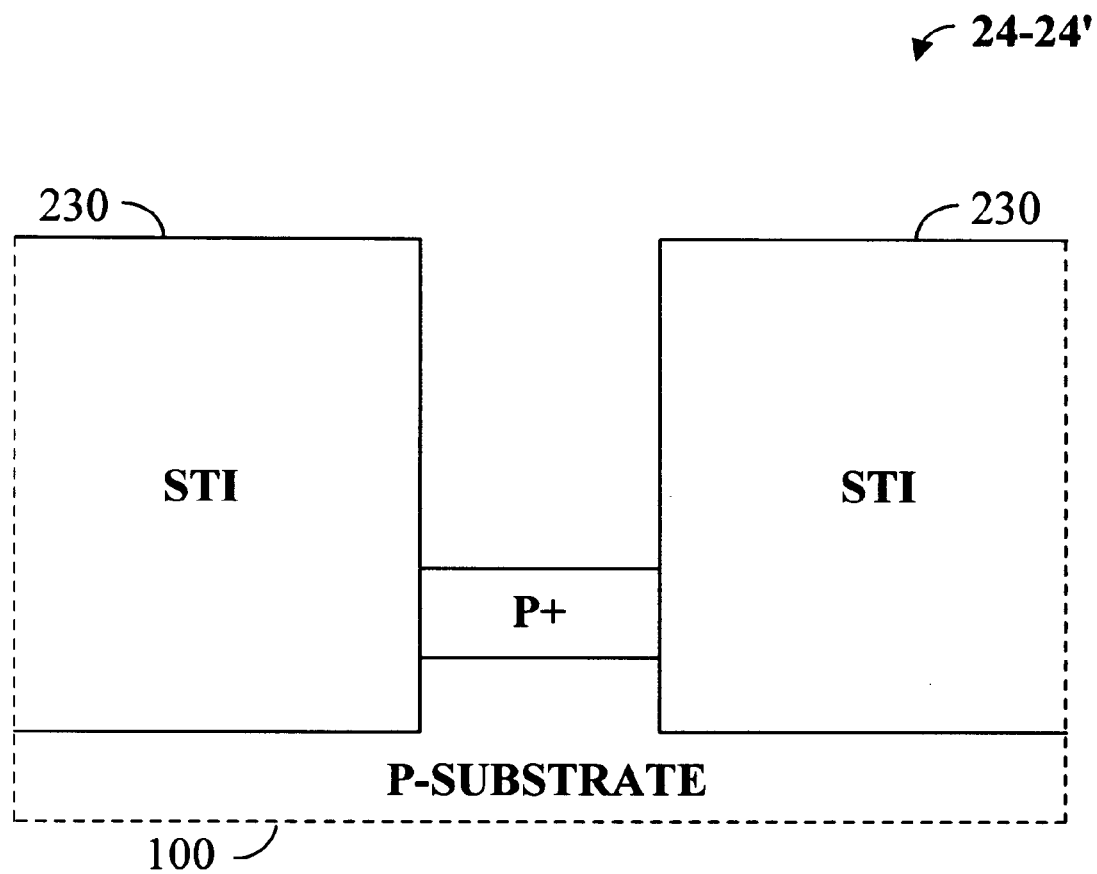

Outside of the silicon islands, the nitride pad has been removed in the course of forming the isolation regions. The remaining pad nitride over the active areas is surrounded by oxide (STI regions 230) and serves to self-align the opening for the silicon pillar which will be formed over the active areas. Photoresist mask 220, used to form the opening for silicon pillar 320, overlaps a portion of pad nitride 226 and STI regions 230. However, since the nitride etch is selective to oxide and photoresist, only the intersection of photoresist opening 1420 and the nitride is etched, as shown in FIG. 14 (i.e., STI regions 230 are not etched). Opening 1420 is the original opening in photoresist mask 220.

Figures 15A, 15B:
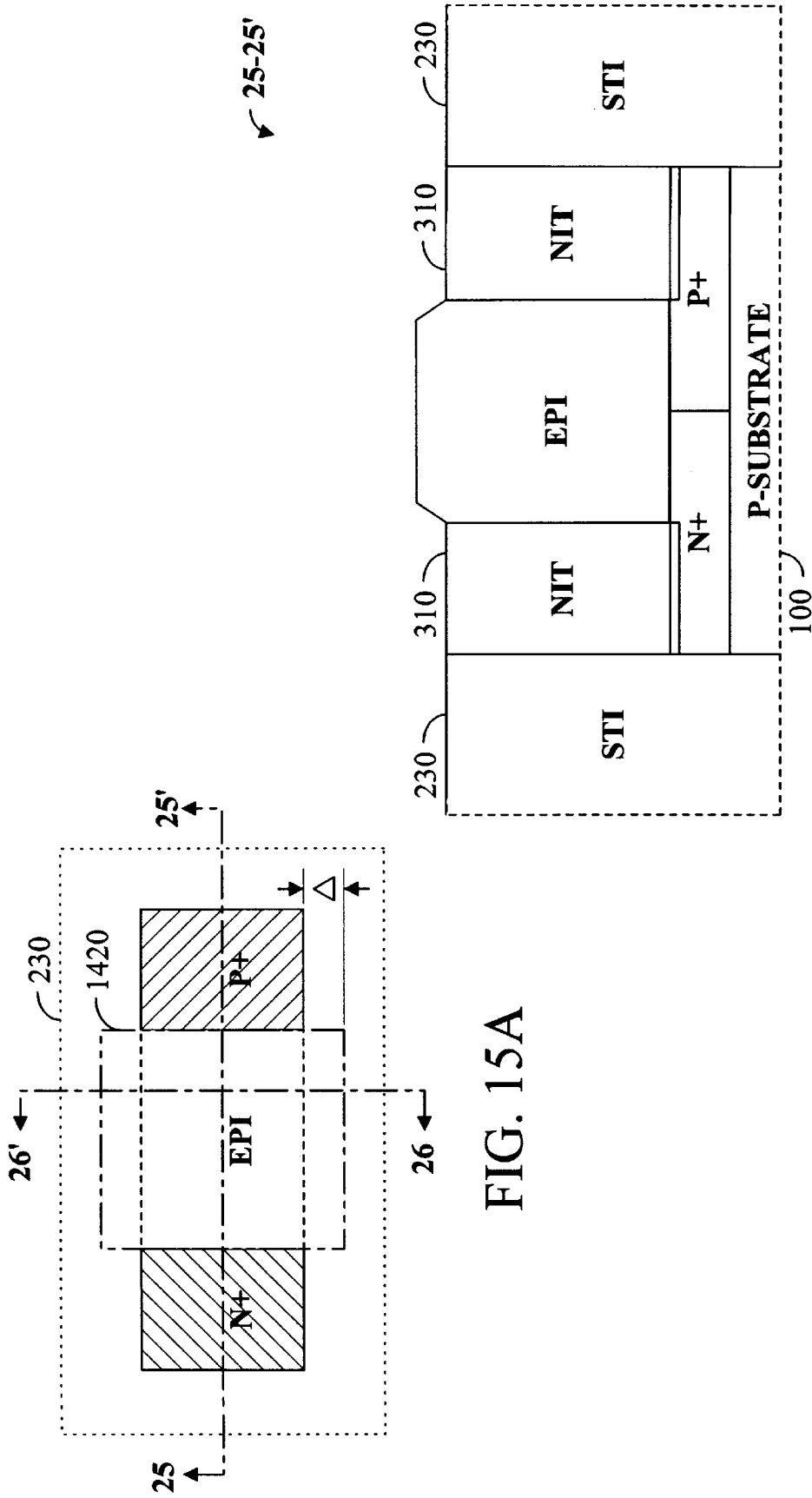
FIGS. 15A–15C are a top and sectional views of the wafer structure of FIG. 2 after etching with a nitride etchant selective to photoresist only and after epitaxial growth of a silicon pillar.
Figure 15C:
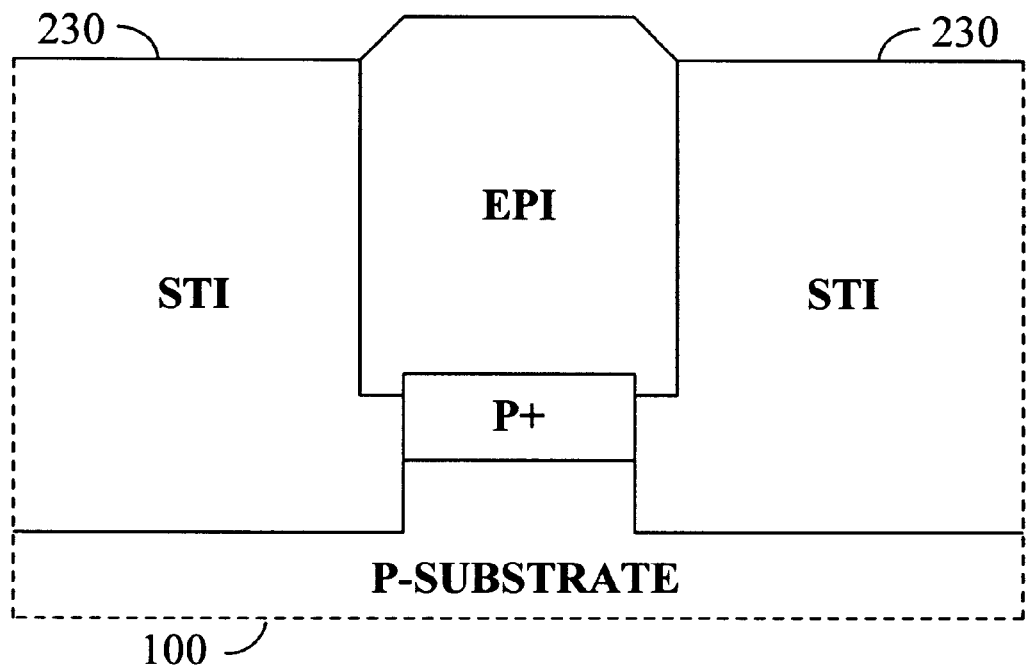

If, on the other hand, a nitride etch which is non-selective to oxide is used, the shape of the opening after etching would be defined solely by opening 1420 in photoresist 220. In that case, an epitaxially grown silicon pillar 320 would overhang the active silicon island and cover a portion of the isolation regions as shown in FIGS. 15A–15C. In this situation, the isolation between adjacent silicon active areas would need to be increased to allow enough room for forming the gate conductor and the associated contact tab without shorting to an adjacent active area for a neighboring device. Due to the increased surface area required, this is not a preferred embodiment.

Figures 16A, 16B:
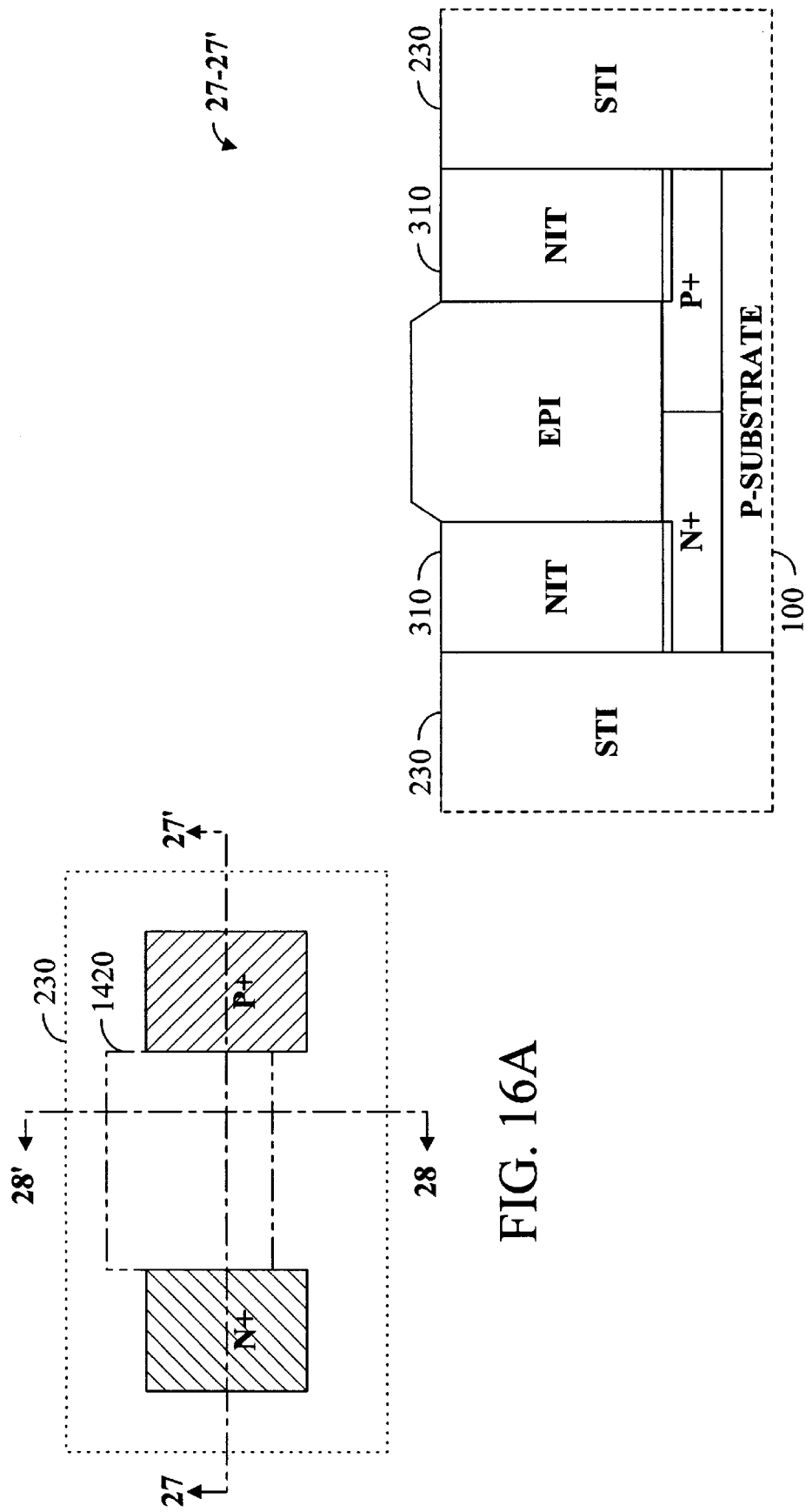
FIGS. 16A–16C are a top and sectional views of the wafer structure of FIG. 2 showing the results of misalignment between the photoresist mask and the underlying active areas.
Figure 16C:
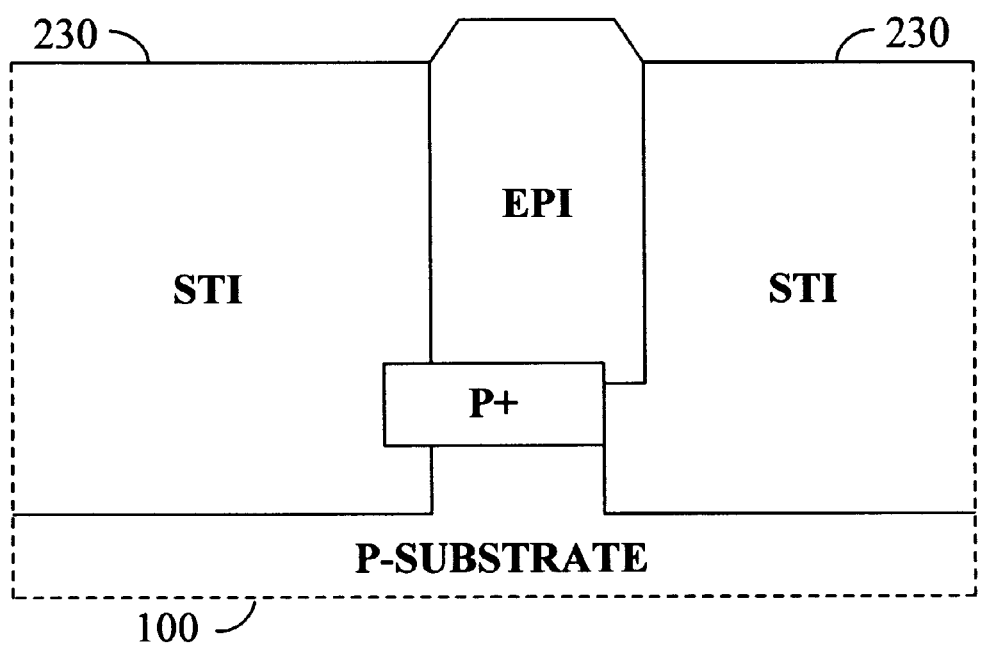

Further, as shown in FIGS. 16A–16C, if the opening for silicon pillar 320 is made to minimum lithographic width, any misalignment with the active area (which is fairly typical in most photolithography processes) would cause additional problems. In this case, not only would silicon pillar 320 overlap STI regions 230, the contact area between silicon pillar 320 and the active area would be reduced. This is typically detrimental to device performance and is, therefore, undesirable. The problem can be corrected by widening the width of the active area, but at the obvious expense of layout density.

As shown in the figures above, with a preferred embodiment of the present invention, a channel for the vertical MOSFET is formed with a body contact on the bottom. Providing a body contact for the pillar transistor alleviates the problems associated with the floating body effect. It is important to note that, as shown in the preceding figures, silicon pillar 320 straddles the N+ and the P+ diffusions, with portions of both diffusions extending beneath silicon pillar 320. This is especially important for an NFET device because if the N+ diffusion did not extend under silicon pillar 320, electron transport from source to drain would be impeded by the bottom corner as the carriers migrate from source to drain. In addition, by creating a silicon pillar that straddles the N+ and P+ diffusions, a low resistance contact to the body is maintained.

While the present invention has been particularly shown and described with reference to preferred embodiments thereof, it will be understood by those skilled in the art that various changes in form and details may be made therein without departing from the spirit and scope of the invention.

What is claimed is:

1. A MOSFET comprising:
   a substrate having a butted junction between a P+ region and an N+ region;
   a silicon pillar straddling and overlapping at least a portion of both the P+ region and the N+ region, the silicon pillar comprising:
     a top portion doped with an impurity corresponding to one of the N+ region and the P+ region;
     a bottom portion; and
     a side;
   an insulating layer on the side of the silicon pillar; and
   a gate formed over the insulating layer on the side of silicon pillar extending from the top portion to the bottom portion.

2. The MOSFET of claim 1 wherein the silicon pillar comprises a single crystal silicon pillar.

3. The MOSFET of claim 1 further comprising a body contact located at least partially beneath the silicon pillar.

4. The transistor of claim 1 further comprising a dielectric layer formed over the gate.

5. A transistor comprising:
   a butted junction between a P+ region and an N+ region;
   a silicon pillar in electrical contact with and straddling the butted junction, the silicon pillar having a top portion and a side;
   a doped region formed at the top portion of the silicon pillar;
   a gate dielectric formed on the side of the silicon pillar; and
   a gate conductor formed on the gate dielectric.

6. The transistor of claim 5 wherein the N+ region comprises a first N+ doped region and the doped region at the top of the silicon pillar comprises a second N+ doped region, wherein the first N+ doped region forms a source diffusion for the transistor and wherein the second N+ region forms a drain diffusion for the transistor and the P+ region forms a body contact for the transistor.

7. The transistor of claim 5 wherein the apparatus is a MOSFET.

8. The transistor of claim 5 further comprising a source contact stud connected to the second N+ region.

9. The transistor of claim 5 further comprising a body contact stud connected to the P+ region.

10. The transistor of claim 5 further comprising a dielectric layer formed over the gate.

11. The transistor of claim 5 further comprising a drain contact stud connected to first N+ doped region.

12. The transistor of claim 11 further comprising a nitride spacer adjacent the drain contact stud.

13. A field effect transistor comprising:
    a semiconductor substrate;
    an N+ region and a P+ region formed in the semiconductor substrate, the N+ region adjacent to the P+ region and forming a butted junction;
    an isolation region surrounding the N+ region and the P+ region;
    a single crystal silicon pillar straddling the butted junction such that the single crystal silicon pillar is in electrical contact with the N+ region and the P+ region, the silicon pillar having a gate side proximate the N+ region and a top portion;
    a N+ implant formed in the top portion of the silicon pillar
    a gate dielectric formed on the gate side of the silicon pillar; and
    a gate conductor formed adjacent to the dielectric;
    a dielectric layer covering the N+ region, the P+ region, the isolation region and the silicon pillar;
    a gate contact stud formed in the dielectric layer, the gate contact stud in electrical contact with the gate conductor;
    a source contact stud formed in the dielectric layer, the source contact stud in electrical contact with the N+ region;
    a drain contact stud formed in the dielectric layer, the drain contact stud in electrical contact with the top portion of the silicon pillar; and
    a body contact stud formed in the dielectric layer, the body contact stud in electrical contact with the P+ region.

* * * * *